(12) United States Patent
Kiuchi

(10) Patent No.: US 8,743,341 B2
(45) Date of Patent: Jun. 3, 2014

(54) IMMERSION EXPOSURE APPARATUS AND IMMERSION EXPOSURE METHOD, AND DEVICE MANUFACTURING METHOD

(75) Inventor: Tohru Kiuchi, Tokyo (JP)

(73) Assignee: Nikon Corporation, Tokyo (JP)

( * ) Notice: Subject to any disclaimer, the term of this patent is extended or adjusted under 35 U.S.C. 154(b) by 765 days.

(21) Appl. No.: 12/926,798

(22) Filed: Dec. 9, 2010

(65) Prior Publication Data

US 2011/0080568 A1     Apr. 7, 2011

Related U.S. Application Data

(62) Division of application No. 11/896,891, filed on Sep. 6, 2007, now Pat. No. 7,872,730.

(60) Provisional application No. 60/844,658, filed on Sep. 15, 2006.

(51) Int. Cl.
  *G03B 27/42* (2006.01)
  *G03B 27/52* (2006.01)
  *G03B 27/58* (2006.01)
  *G03F 7/20* (2006.01)

(52) U.S. Cl.
  CPC .................................. *G03F 7/70341* (2013.01)
  USPC ................... 355/53; 355/30; 355/72

(58) Field of Classification Search
  CPC ........................... G03F 7/0341; G03F 7/70733
  USPC .................... 355/30, 53, 72; 250/548
  See application file for complete search history.

(56) References Cited

U.S. PATENT DOCUMENTS 4,346,164 A    8/1982   Tabarelli et al.
4,480,910 A    11/1984  Takanashi et al.
(Continued)

FOREIGN PATENT DOCUMENTS

DE    221 563 A1    9/1983
DE    224 448 A1    7/1985
(Continued)

OTHER PUBLICATIONS

Mar. 3, 2008 Written Opinion issued in corresponding International Application No. PCT/JP2007/068224.

(Continued)

*Primary Examiner* — Hung Henry Nguyen
(74) *Attorney, Agent, or Firm* — Oliff PLC

(57) ABSTRACT

An immersion type exposure apparatus comprises: an optical member from which an exposure beam is emitted; a first movable member that is movable while holding a substrate, in a predetermined region including a first region including a position facing the optical member and a second region different from the first region; a second movable member that is movable while holding the substrate independently from a first movable member, in a predetermined region including the first region and the second region; a first connection member that is releasably and alternately connected with the first movable member and the second movable member, and moves one movable member in the first region; a second connection member that is releasably and alternately connected with the first movable member and the second movable member, and moves the other movable member in the second region; and a third movable member that is provided on the first connection member and is movable to a position facing the optical member; and at least one of the first movable member, the second movable member, and the third movable member is moved to the position facing the optical member so that a beam path on the emitting side of the optical member is kept filled with a liquid.

8 Claims, 11 Drawing Sheets

(56) References Cited

U.S. PATENT DOCUMENTS

| | | | |
|---|---|---|---|
| 5,610,683 A | 3/1997 | Takahashi | |
| 5,677,758 A | 10/1997 | McEachern et al. | |
| 5,715,039 A | 2/1998 | Fukuda et al. | |
| 5,825,043 A | 10/1998 | Suwa | |
| 5,969,441 A | 10/1999 | Loopstra et al. | |
| 6,208,407 B1 | 3/2001 | Loopstra | |
| 6,262,796 B1 | 7/2001 | Loopstra et al. | |
| 6,341,007 B1 | 1/2002 | Nishi et al. | |
| 6,498,350 B2 | 12/2002 | Kwan et al. | |
| 6,611,316 B2 | 8/2003 | Sewell | |
| 6,710,849 B2 | 3/2004 | Kwan et al. | |
| 6,778,257 B2 | 8/2004 | Bleeker et al. | |
| 6,952,253 B2 | 10/2005 | Lof et al. | |
| 7,075,616 B2 | 7/2006 | Derksen et al. | |
| 7,116,401 B2 | 10/2006 | Nijmeijer et al. | |
| 7,119,876 B2 | 10/2006 | Van Der Toorn et al. | |
| 7,161,659 B2 * | 1/2007 | Van Den Brink et al. | 355/53 |
| 7,321,419 B2 * | 1/2008 | Ebihara | 355/72 |
| 7,872,730 B2 | 1/2011 | Kiuchi | |
| 8,045,136 B2 * | 10/2011 | Shibazaki | 355/53 |
| 2004/0165159 A1 | 8/2004 | Lof et al. | |
| 2004/0263809 A1 | 12/2004 | Nakano | |
| 2005/0280791 A1 | 12/2005 | Nagasaka et al. | |
| 2006/0023186 A1 | 2/2006 | Binnard | |
| 2006/0114445 A1 | 6/2006 | Ebihara | |
| 2006/0132733 A1 | 6/2006 | Modderman | |
| 2007/0127006 A1 | 6/2007 | Shibazaki | |

FOREIGN PATENT DOCUMENTS

| | | |
|---|---|---|
| EP | 1 647 865 A1 | 4/2006 |
| EP | 1 791 164 A1 | 5/2007 |
| JP | A 58-202448 | 11/1983 |
| JP | A 59-19912 | 2/1984 |
| JP | A 62-65326 | 3/1987 |
| JP | A 63-157419 | 6/1988 |
| JP | A 4-305915 | 10/1992 |
| JP | A 4-305917 | 10/1992 |
| JP | A 5-62877 | 3/1993 |
| JP | A 6-124873 | 5/1994 |
| JP | A 7-220990 | 8/1995 |
| JP | A 8-316125 | 11/1996 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-176727 | 7/1999 |
| JP | A 2000-58436 | 2/2000 |
| JP | A 2000-505958 | 5/2000 |
| JP | A 2000-511704 | 9/2000 |
| JP | A 2000-323404 | 11/2000 |
| JP | A 2001-223159 | 8/2001 |
| JP | A 2001-513267 | 8/2001 |
| JP | A 2002-158168 | 5/2002 |
| JP | A 2004-519850 | 7/2004 |
| JP | A 2004-289126 | 10/2004 |
| JP | A 2004-289128 | 10/2004 |
| JP | A-2006-100686 | 4/2006 |
| WO | WO 99/49504 A1 | 9/1999 |
| WO | WO 01/35168 A1 | 5/2001 |
| WO | WO 2004/019128 A2 | 3/2004 |
| WO | WO 2004/086468 A1 | 10/2004 |
| WO | WO 2004/090577 A2 | 10/2004 |
| WO | WO 2005/024517 A2 | 3/2005 |
| WO | WO 2005/059617 A2 | 6/2005 |
| WO | WO 2005/059618 A2 | 6/2005 |
| WO | WO 2005/074014 A1 | 8/2005 |
| WO | WO 2006/013806 A1 | 2/2006 |

OTHER PUBLICATIONS

Mar. 3, 2008 International Search Report issued in PCT Application No. PCT/JP2007/068224.

Apr. 22, 2010 Notice of Allowance issued in U.S. Appl. No. 11/896,891.

Sep. 9, 2010 Notice of Allowance issued in U.S. Appl. No. 11/896,891.

* cited by examiner

IMMERSION EXPOSURE APPARATUS AND IMMERSION EXPOSURE METHOD, AND DEVICE MANUFACTURING METHOD

CROSS-REFERENCE TO RELATED APPLICATION

This application is a Division of application Ser. No. 11/896,891 filed Sep. 6, 2007 (now U.S. Pat. No. 7,872,730), which claims the benefit of U.S. Provisional Application No. 60/844,658 filed Sep. 15, 2006. The disclosure of the prior applications is hereby incorporated by reference herein in its entirety.

BACKGROUND

1. Field of the Invention

The present invention relates to an immersion exposure apparatus and immersion exposure method, and a device manufacturing method.

2. Description of Related Art

In exposure apparatuses used in the photolithography process, immersion exposure apparatuses as disclosed in Japanese Unexamined Patent Application, First Publication No. 2004-289126 (corresponding to U.S. Pat. No. 6,952,253) and Japanese Unexamined Patent Application, First Publication No. 2004-289128 (corresponding to U.S. Pat. No. 7,075,616) which expose a substrate via a liquid are known. In addition, multi stage type (twin stage type) exposure apparatuses as disclosed in Published Japanese Translation No. 2000-511704 of PCT International Publication (corresponding to U.S. Pat. No. 6,262,796), Japanese Unexamined Patent Application, First Publication No. 2000-323404 (corresponding to U.S. Pat. No. 7,116,401), Japanese Unexamined Patent Application, First Publication No. 2000-505958 (corresponding to U.S. Pat. No. 5,969,441), Published Japanese Translation No. 2001-513267 of PCT International Publication (corresponding to U.S. Pat. No. 6,208,407), Japanese Unexamined Patent Application, First Publication No. 2002-158168 (corresponding to U.S. Pat. No. 6,710,849), comprising a plurality of substrate stages which hold a substrate are known.

In an immersion exposure apparatus, for example, if all of the liquid is recovered each time a substrate stage is separated from the projection optical system, such as at the time of exchanging a substrate, there is a possibility that throughput of the exposure apparatus declines. Moreover, when all of the liquid is recovered and the light emitting surface of the projection optical system is changed from a wet state into a dry state, there is a possibility that vaporization of the liquid causes formation of adhesion marks (water marks) of the liquid on the light emitting surface of the projection optical system, and produces temperature change, thus deteriorating the exposure accuracy. Accordingly, desirably, the light emitting surface of the projection optical system is kept wet with liquid at all times.

In a multi-stage type exposure apparatus, as in the conventional way, in the case where there is an attempt to keep the light emitting surface of the projection optical system wet with a liquid at all times by holding a cap member (shutter member) so as to face the light emitting surface of the projection optical system, there is a possibility that an undesirable conditions exists where the cap member drops down, the liquid on the cap member leaks, or the like. Moreover, there is a possibility that the throughput of the exposure apparatus declines due to the operation for transferring the cap member to/from the substrate stage. Accordingly, a technique is desired in which the light emitting surface of the projection optical system is kept wet with a liquid at all times so that the substrate can be efficiently exposed even in a case where the immersion method is applied to a multi-stage type exposure apparatus.

A purpose of some aspects of the invention is to provide an immersion exposure apparatus, immersion exposure method, and a device manufacturing method in which the substrate can be efficiently exposed even in a case where the immersion method is applied to a multi-stage type exposure apparatus.

SUMMARY

According to a first aspect of the present invention, there is provided an optical member from which the exposure beam is emitted; a first movable member that is movable while holding a substrate, in a predetermined region including a first region including a position facing the optical member and a second region different from the first region; a second movable member that is movable while holding a substrate independently from the first movable member, in a predetermined region including the first region and the second region; a first connection member that is releasably and alternately connected with the first movable member and the second movable member, and allows the movement of one of the first and the second movable members in the first region; a second connection member that is releasably and alternately connected with the first movable member and the second movable member, and allows the movement of the other one of the first and the second movable members in the second region; a third movable member that is provided at the first connection member and has a surface between which and the optical member can be held a liquid; a first driving device that moves the first connection member; a second driving device that moves the second connection member; and a third driving device that moves the third movable member with respect to the first connection member substantially parallel to the surface of the third movable member, wherein at least one of the first movable member, the second movable member, and the third movable member is moved to the position facing the optical member so that a beam path on the emitting side of the optical member is kept filled with a liquid.

According to the first aspect of the present invention, the substrate can be efficiently and satisfactorily exposed.

According to a second aspect of the present invention, there is provided an immersion type exposure apparatus for exposing a substrate with an exposure beam, comprising: an optical member from which the exposure beam is emitted; a movable member that has a holder portion for holding the substrate and a flat portion, and is movable with respect to the optical member; a first movement system that has a connection member connected to the movable member, the movable member moving by the movement of the connection member; a liquid holding member that has a surface capable of holding a liquid in a state of facing the optical member, and is provided at the connection member; and a second movement system that moves the liquid holding member with respect to the connection member substantially parallel to the surface of the liquid holding member to change the relative position between the movable member and the liquid holding member.

According to the second aspect of the present invention, a liquid for exposure can be held between the optical member and the liquid holding member, and the substrate can be efficiently exposed.

According to a third aspect of the present invention, there is provided a device manufacturing method using the exposure apparatus of the above aspect.

According to the third aspect of the present invention, a device can be manufactured using an exposure apparatus that can efficiently expose the substrate.

According to a fourth aspect of the present invention, there is provided an immersion type exposure method for exposing a substrate with an exposure beam via an optical member, comprising: loading a substrate onto a first movable member that is movable in a predetermined region including a first region including a position facing the optical member and a second region different from the first region, loading a substrate onto a second movable member that is movable independently from the first movable member, in a predetermined region including the first region and the second region; moving the first connection member connected to the first movable member, and thereby moving the first movable member, so as to execute an exposure process of the substrate held on the first movable member; moving the second connection member connected to the second movable member, and thereby moving the second movable member, so as to execute a measurement process of the substrate held on the second movable member, in parallel with at least a part of the exposure process; and after the exposure process and the measurement process are completed, moving the first movable member, the second movable member, and a third movable member provided at the first connection member so as to change a first state where the first movable member and the optical member are opposed, through a second state where the optical member and the third movable member are opposed, to a third state where the second movable member and the optical member are opposed, so that a beam path on the emitting side of the optical member is kept filled with liquid, wherein the third movable member is moved with respect to the first connection member in the second state.

According to the fourth aspect of the present invention, the substrate can be efficiently exposed.

According to a fifth aspect of the present invention, there is provided a device manufacturing method including the exposure method of the above aspect.

According to the fifth aspect of the present invention, a device can be manufactured by an exposure method in which the substrate can be efficiently exposed.

According to the some aspects of the present invention, a substrate can be efficiently exposed. Furthermore, the aspects of the present invention can manufacture a device having a desired performance with a high productivity.

DESCRIPTION OF THE PREFERRED EMBODIMENTS

Hereunder is a description of embodiments of the present invention with reference to the drawings. However the present invention is not limited to this description. In the following description, an XYZ rectangular co-ordinate system is established, and the positional relationship of respective members is described with reference to this XYZ rectangular co-ordinate system. A predetermined direction within a horizontal plane is made the X axis direction, a direction orthogonal to the X axis direction in the horizontal plane is made the Y axis direction, and a direction orthogonal to both the X axis direction and the Y axis direction (that is, a perpendicular direction) is made the Z axis direction. Furthermore, rotation (inclination) directions about the X axis, the Y axis and the Z axis, are made the θX, the θY, and the θZ directions respectively.

Figure 1:
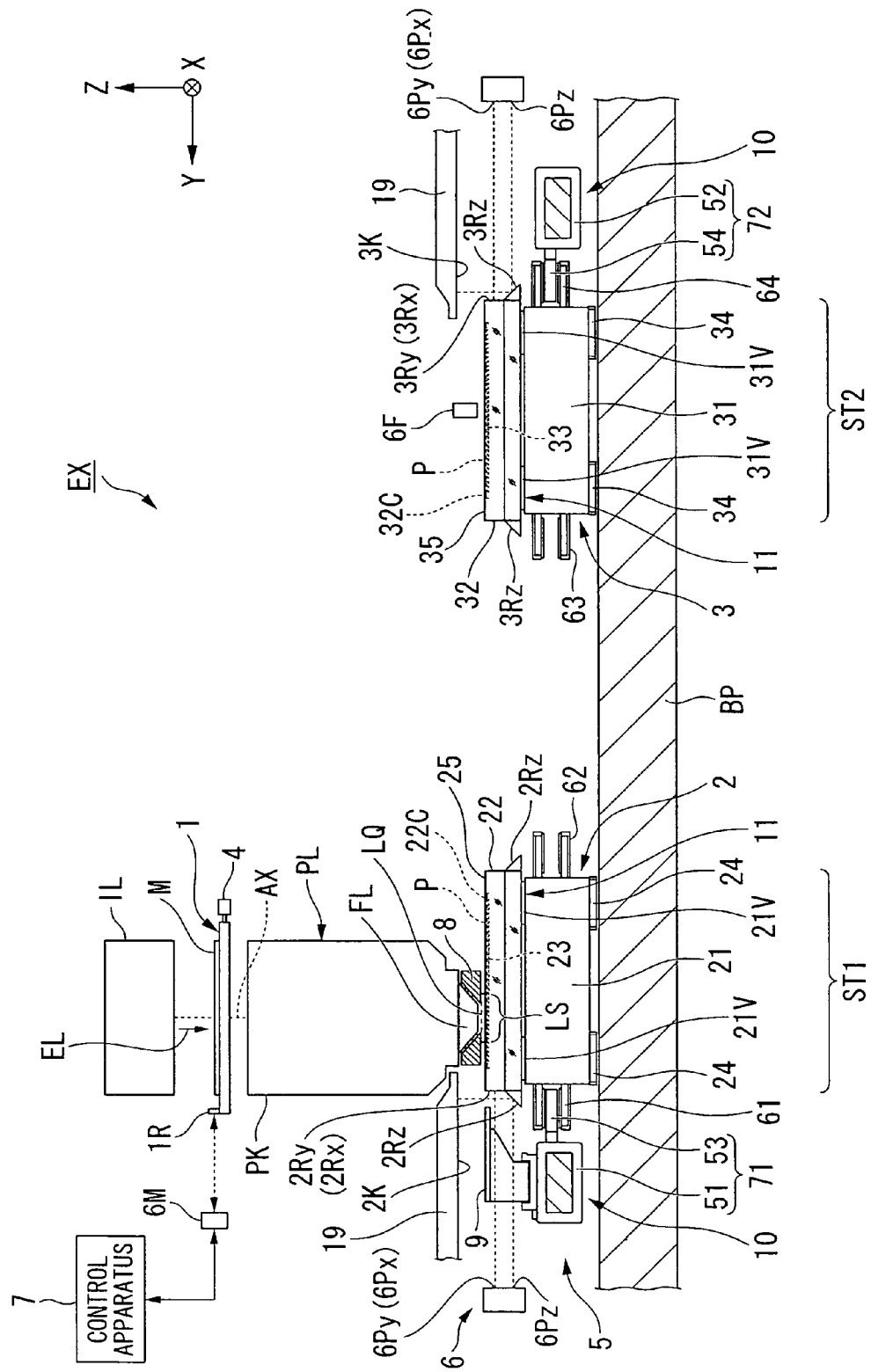
FIG. 1 is a schematic block diagram that shows an exposure apparatus according to the present embodiment.

FIG. 1 is a schematic block diagram that shows the exposure apparatus EX according to the present embodiment. In FIG. 1, the exposure apparatus EX includes; a mask stage 1 which is movable while holding a mask M, a first substrate stage 2 which is movable while holding a substrate P, a second substrate stage 3 which is movable while holding the substrate P independently from the first substrate stage 2, a drive system 4 that moves the mask stage 1, a drive system 5 that moves the first substrate stage 2 and the second substrate stage 3, a measurement system 6 including a laser interferometer that measures the position information of the respective stages 1, 2, and 3, an illumination optical system IL that illuminates a mask M held on the mask stage 1 with exposure light EL, a projection optical system PL that projects a pattern image of the mask M illuminated by the exposure light EL onto the substrate P, and a control apparatus 7 that controls operation of the whole exposure apparatus EX.

The substrate P here is a substrate for producing a device, and includes a substrate of a semiconductor wafer or the like, such as a silicon wafer, having a film of a photosensitive material (photoresist) or the like formed thereon, or having various types of membrane such as a protective membrane (top coat membrane) other than a photosensitive membrane coated thereon. The mask M includes a reticle formed with a device pattern to be projected onto the substrate P. In the present embodiment, a transmission mask is used as the mask, however a reflecting mask may be used. The transmission type mask is not limited to a binary mask on which the pattern is formed by a light shielding membrane, and includes, for example, a half tone type or a phase shift mask such as a spatial frequency modulation type.

The exposure apparatus EX of the present embodiment is a multi-stage type (twin stage type) exposure apparatus including a plurality of (two) substrate stages 2 and 3 capable of holding and moving the substrate P, as disclosed in Japanese Unexamined Patent Application, First Publication No. H10-163099, Japanese Unexamined Patent Application, First Publication No. H10-214783 (corresponding to U.S. Pat. No. 6,341,007), Published Japanese Translation No. 2000-505958 of PCT International Publication (corresponding to U.S. Pat. No. 5,969,441), Published Japanese Translation No. 2000-511704 of PCT International Publication (corresponding to U.S. Pat. No. 6,262,796), Japanese Unexamined Patent Application, First Publication No. 2000-323404 (corresponding to U.S. Pat. No. 7,116,401), Published Japanese Translation No. 2001-513267 of PCT International Publication (corresponding to U.S. Pat. No. 6,208,407), Japanese Unexamined Patent Application, First Publication No. 2002-158168 (corresponding to U.S. Pat. No. 6,710,849), and the like. The exposure apparatus EX includes an exposure station ST1 in which the substrate P is irradiated with exposure light EL and a measurement station ST2 in which a predetermined measurement is performed and the substrate P is exchanged. The first substrate stage 2 and the second substrate stage 3 are respectively movable between the exposure station ST1 and the measurement station ST2, while holding the substrate P.

The exposure apparatus EX of the present embodiment is an immersion exposure apparatus applicable to an immersion method for substantially shortening the exposure length and improving the resolution, and also substantially expanding the depth of focus. It includes a nozzle member 8 capable of forming an immersion space LS of a liquid LQ so that an optical path space of exposure light EL is filled with the liquid LQ. Operation of the immersion system 1 is controlled by a control apparatus 7. The optical path space of exposure light EL is a space including an optical path on which the exposure light EL travels. The immersion space LS is a spaced filled with the liquid LQ. The exposure apparatus EX irradiates the substrate P with the exposure light EL via the projection optical system PL and the liquid LQ, to expose the substrate P.

The nozzle member 8 includes a seal member (a liquid confinement member) as disclosed in Japanese Unexamined Patent Application, First Publication No. 2004-289126 (corresponding to U.S. Pat. No. 6,952,253), Japanese Unexamined Patent Application, First Publication No. 2004-289128 (corresponding to U.S. Pat. No. 7,075,616), and the like, and includes a passage that supplies and recovers the liquid LQ with respect to the optical path space of exposure light EL. The passage is not shown in the drawing. To the passage are connected a liquid supply apparatus that supplies liquid LQ to the optical path space of exposure light EL via the passage, and a liquid recovery apparatus that recovers the liquid LQ. The liquid supply apparatus is capable of supplying the liquid LQ for forming the immersion space LS to the optical path space of exposure light EL via the passage. The liquid recovery apparatus is capable of recovering the liquid LQ in the immersion space LS via the passage. In the present embodiment, water (pure water) is used as the liquid LQ.

The nozzle member 8 is capable of forming the immersion space LS between the nozzle member 8 and a facing object. In the present embodiment, the nozzle member 8 is arranged in the vicinity of a terminal optical element FL which is the closest to the image plane of the projection optical system PL, among a plurality of optical elements of the projection optical system PL, and is capable of forming the immersion space LS between the nozzle member 8 and an object arranged in the position that can be irradiated with exposure light EL on the light emitting side of the terminal optical element FL (image plane side of the projection optical system PL), that is, between the nozzle member 8 and an object arranged in a position facing the light emitting surface of the terminal optical element FL. The nozzle member 8 forms the immersion space LS of the liquid LQ by holding the liquid LQ between the nozzle member 8 and the object, so as to fill the optical path space of exposure light EL on the light emitting side of the terminal optical element FL, specifically the optical path space of exposure light EL between the terminal optical element FL and the object, with the liquid LQ.

The object capable of facing the nozzle member 8 and the terminal optical element FL includes an object which is movable at the light emitting side of the terminal optical element FL. In the present embodiment, the object capable of facing the nozzle member 8 and the terminal optical element FL includes at least one of the first substrate stage 2 and the second substrate stage 3 which are movable at the light emitting side of the terminal optical element FL. In addition, the object capable of facing the nozzle member 8 and the terminal optical element FL includes the substrate P held on the first substrate stage 2 and the second substrate stage 3. Each of the first substrate stage 2 and the second substrate stage 3 is movable to a position facing the nozzle member 8 and the terminal optical element FL. The nozzle member 8 is capable of forming the immersion space LS of the liquid LQ by holding the liquid LQ between the nozzle member 8, the terminal optical element FL, and the first substrate stage 2 or the second substrate stage 3, so as to fill the optical path space of exposure light EL on the light emitting side of the terminal optical element FL, with the liquid LQ.

As described later, in the present embodiment, the exposure apparatus EX includes an auxiliary table 9 which is movable to a position facing the nozzle member 8 and the terminal optical element FL. The auxiliary table 9 is also movable on the light emitting side of the terminal optical element FL. The nozzle member 8 is capable of forming the immersion space LS of the liquid LQ between and the auxiliary table 9 by holding the liquid LQ between the nozzle member 8, terminal optical element FL, and the auxiliary table 9, so as to fill the optical path space of exposure light EL on the light emitting side of the terminal optical element FL, with the liquid LQ.

In the present embodiment, the nozzle member 8 forms the immersion space LS between the terminal optical element FL, the nozzle member 8, and an object (at least one of the first substrate stage 2, the second substrate stage 3, the substrate P, and the auxiliary table 9) so that a region that is a part of the surface of the object (local region) is covered with the liquid LQ of the immersion space. That is, in the present embodiment, the exposure apparatus EX adopts a local liquid immersion method where the immersion space LS is formed between the terminal optical element FL, the nozzle member 8, and the substrate P, so that a partial region on the substrate P is covered with the liquid LQ of the immersion space LS during the exposure of the substrate P.

The exposure apparatus EX of the present embodiment is a scanning type exposure apparatus (so called scanning stepper) which projects the pattern image of the mask M onto the substrate P while the mask M and the substrate P are simultaneously moved in a predetermined scanning direction. In the present embodiment, the scanning direction (simultaneous movement direction) of the substrate P is the Y axis direction, and the scanning direction (simultaneous movement direction) of the mask M is also the Y axis direction. While moving the substrate P in the Y axis direction with respect to the projection region of the projection optical system PL, as well as moving the mask M in the Y axis direction with respect to the illumination region of the illumination optical system IL simultaneously with the movement of the substrate P in the Y axis direction, the exposure apparatus EX irradiates the substrate P with exposure light EL via the projection optical system PL and the liquid LQ, so as to expose the substrate P. As a result, the pattern image of the mask M is projected onto the substrate P.

The illumination optical system IL illuminates a predetermined illumination region on the mask M with exposure light EL of a uniform luminance distribution. For the exposure light EL emitting from the illumination optical system IL, for example emission lines (g-ray, h-ray, i-ray), emitted for example from a mercury lamp, deep ultraviolet beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm), may be used. In this embodiment, the ArF excimer laser beam is used.

The mask stage 1 is moveable in the X axis, the Y axis, and the θZ directions while holding the mask M, by means of the drive system 4 which includes an actuator such as a linear motor. Positional information of the mask stage 1 (and consequently the mask M) is measured by a laser interferometer 6M of the measurement system 6. The laser interferometer 6M uses a measurement mirror 1R which is provided on the mask stage 1 to measure the position information of the X axis, the Y axis, and the θZ direction of the mask stage 1. The control apparatus 7 drives the drive system 4 based on the measured results of the measurement system 6, and controls the position of the mask M which is held on the mask stage 1.

The projection optical system PL projects a pattern image of the mask M onto the substrate P at a predetermined projection magnification. The projection optical system PL has a plurality of optical elements, and these optical elements are held in a lens barrel PK. In the embodiment, the projection optical system PL is a reduction system with a projection magnification of for example ¼, ⅕, ⅛ or the like. The projection optical system PL may be a reduction system, an equal system, or a magnification system. In the embodiment, the optical axis AX of the projection optical system PL is parallel to the z direction. Furthermore, the projection optical system PL may include any one of a refractive system which does not include a reflection optical element, a reflection system which does not include a refractive optical element, or a cata-dioptric system which includes a reflection optical system and a refractive optical system. Moreover, the projection optical system PL may form either an inverted image or an erect image.

The exposure light EL emitting from the illumination optical system IL and passing through the mask M is incident from the object plane side of the projection optical system PL into the projection optical system PL. The projection optical system PL is capable of emitting the exposure light EL that has been incident from the object plane side, from the light emitting surface (bottom face) of the terminal optical element, and irradiating onto the substrate P.

The first substrate stage 2 has a stage main-structure 21, and a first substrate table 22 supported on the stage main-structure 21 and having a substrate holder 23 which releasably holds the substrate P. The stage main-structure 21 is supported on the top face (guide face) of the base member BP in a non contact manner by an air bearing 24. The first substrate table 22 has a recessed portion 22C, and the substrate holder 23 is arranged in the recessed portion 22C. The top face 25 around the recessed portion 22C of the first substrate table 22 is substantially flat, and substantially at the same height (flush) as the surface of the substrate P held by the substrate holder 23. That is, the first substrate table 22 has the top face 25 which is substantially flush with the surface of the substrate P held by the substrate holder 23 of the first substrate table 22. The first substrate stage 2 is movable by the drive system 5 in directions of six degrees of freedom of the X axis, the Y axis, the Z axis, the θX, the θY, and the θZ directions, on the base member BP, while holding the substrate P by the substrate holder 23.

The second substrate stage 3 has a stage main-structure 31, and a second substrate table 32 supported on the stage main-structure 31 and having a substrate holder 33 which detachably holds the substrate P. The stage main-structure 31 is supported on the top face (guide face) of the base member BP in a non contact manner by an air bearing 34. The second substrate table 32 has a recessed portion 32C, and the substrate holder 33 is arranged in the recessed portion 32C. The top face 35 around the recessed portion 32C of the second substrate table 32 is substantially flat, and substantially at the same height (flush) as the surface of the substrate P held by the substrate holder 33. That is, the second substrate table 32 has the top face 35 which is substantially flush with the surface of the substrate P held by the substrate holder 33 of the second substrate table 32. The second substrate stage 3 is movable by the drive system 5 in directions of six degrees of freedom of the X axis, the Y axis, the Z axis, the θX, the θY, and the θZ directions, on the base member BP, while holding the substrate P by the substrate holder 33.

Moreover, the first substrate stage 2 including the stage main-structure 21 and the first substrate table 22, and the second substrate stage 3 including the stage main-structure 31 and the second substrate table 32 have substantially same shape, size, and structure. In the present embodiment, the first substrate table 22 of the first substrate stage 2 and the second substrate table 32 of the second substrate stage 3 are respectively in a substantially rectangular shape in the XY plane.

In the present embodiment, the stage main-structure (21, 31) and the substrate table (22, 32) are relatively movable, however the stage main-structure and the substrate table may be integrally provided.

The drive system 5 includes an actuator such as a linear motor, and is capable of moving the respective first substrate stage 2 and the second substrate stage 3. The drive system 5 includes a coarse movement system 10 which moves the respective stage main-structures 21 and 31 on the base member BP, and a fine movement system 11 which moves the respective substrate tables 22 and 32 on the respective stage main-structures 21 and 31.

The coarse movement system 10 includes an actuator such as a linear motor, and is capable of moving the respective stage main-structures 21 and 31 on the base member BP in the X axis, the Y axis, and the θZ directions. The respective stage main-structures 21 and 31 are moved in the X axis, the Y axis, and the θZ directions by the coarse movement system 10, and thereby the respective substrate tables 22 and 32 mounted on the respective stage main-structures 21 and 31 are moved together with the respective stage main-structures 21 and 31 in the X axis, the Y axis, and the θZ directions.

Figure 2:
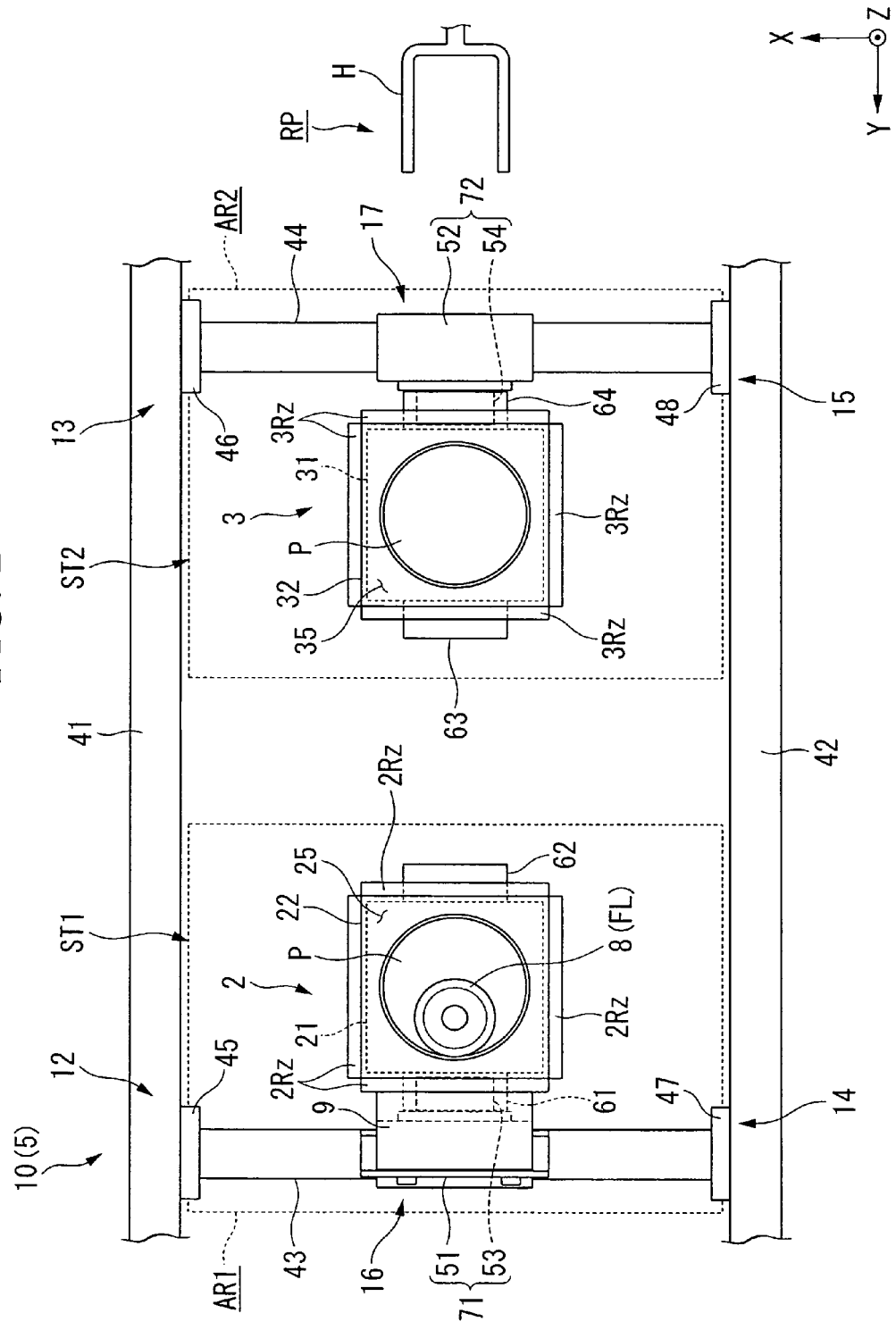
FIG. 2 shows a first substrate stage and a second substrate stage viewed from the top side.

FIG. 2 shows the first substrate stage 2 and the second substrate stage 3 viewed from the top side. In FIG. 2, the coarse movement system 10 for moving the first substrate stage 2 and the second substrate stage 3 includes a plurality of linear motors 12, 13, 14, 15, 16, and 17. The coarse movement system 10 includes a pair of Y axis guide members 41 and 42 extending in the Y axis direction. The Y axis guide members 41 and 42 respectively include a magnet unit having a plurality of permanent magnets. One Y axis guide member 41 supports two slide members 45 and 46 movably in the Y axis direction, and the other Y axis guide member 42 supports two slide members 47 and 48 movably in the Y axis direction. The slide members 45, 46, 47, and 48 respectively include a coil unit having an armature coil. That is, in the present embodiment, the moving coil type Y axis linear motors 12, 13, 14, and 15 are formed by the slide members 45, 46, 47, and 48 having a coil unit and the Y axis guide members 41 and 42 having a magnet unit.

Moreover, the coarse movement system 10 includes a pair of X axis guide members 43 and 44 extending in the X axis direction. The X axis guide members 43 and 44 respectively include a coil unit having an armature coil. One X axis guide member 43 supports a slide member 51 movably in the X axis direction, and the other X axis guide member 44 supports a slide member 52 movably in the X axis direction. The slide members 51 and 52 respectively include a magnet unit having a plurality of permanent magnets. In FIG. 1 and FIG. 2, the slide member 51 is connected to the stage main-structure 21 of the first substrate stage 2, and the slide member 52 is connected to the stage main-structure 31 of the second substrate stage 3. That is, in the present embodiment, the moving magnet type X axis linear motor 16 is formed by the slide member 51 having a magnet unit and the X axis guide member 43 having a coil unit. In the same manner, the moving magnet type X axis linear motor 17 is formed by the slide member 52 having a magnet unit and the X axis guide member 44 having a coil unit. In FIG. 1 and FIG. 2, the first substrate stage 2 (stage main-structure 21) is moved in the X axis direction by the X axis linear motor 16, and the second substrate stage 3 (stage main-structure 31) is moved in the X axis direction by the X axis linear motor 17.

The slide members 45 and the 47 are respectively fixed to the opposite ends of the X axis guide member 43, and the slide members 46 and 48 are respectively fixed to the opposite ends of the X axis guide member 44. Consequently, the X axis guide member 43 is movable in the Y axis direction by the Y axis linear motors 12 and 14, and the X axis guide member 44 is movable in the Y axis direction by the Y axis linear motors 13 and 15. In FIG. 1 and FIG. 2, the first substrate stage 2 (stage main-structure 21) is moved in the Y axis direction by the Y axis linear motors 12 and 14, and the second substrate stage 3 (stage main-structure 31) is moved in the Y axis direction by the Y axis linear motors 13 and 15.

Moreover, by slightly changing the driving forces which are respectively generated by a pair of the Y axis linear motors 12 and 14, the position of the first substrate stage 2 in the $\theta Z$ direction can be controlled. By slightly changing the driving forces which are respectively generated by a pair of the Y axis linear motors 13 and 15, the position of the second substrate stage 3 in the $\theta Z$ direction can be controlled.

In the present embodiment, the substrate tables 22 and 32 are movably supported on the stage main-structures 21 and 31, respectively.

As shown in FIG. 1, the fine movement system 11 includes an actuator 21V or 31V such as a voice coil motor interposed respectively between the stage main-structure 21 or 31 and the substrate table 22 or 32, and a measurement instrument (such as an encoder, not shown) which measures the drive amount of the respective actuators, and is capable of moving the respective substrate tables 22 or 32 on the stage main-structure 21 or 31 at least in the Z axis, the $\theta X$, and the $\theta Y$ directions. Furthermore, the fine movement system 11 is capable of moving (fine motion) the respective substrate tables 22 or 32 on the stage main-structure 21 or 31 in the X axis, the Y axis, the $\theta Z$ directions.

In such a manner, the drive system 5 including the coarse movement system 10 and the fine movement system 11 is capable of moving each of the first substrate table 22 and the second substrate table 32 in directions of six degrees of freedom of the X axis, the Y axis, the Z axis, the $\theta X$, the $\theta Y$, and the $\theta Z$ directions.

Moreover, each of the first substrate stage 2 (stage main-structure 21) and the second substrate stage 3 (stage main-structure 31) is releasably connected to the slide member 51 or 52 via a joint member for example as disclosed in Published Japanese Translation No. 2000-505958 of PCT International Publication (corresponding to U.S. Pat. No. 5,969,441), Published Japanese Translation No. 2000-511704 of PCT International Publication (corresponding to U.S. Pat. No. 6,262,796), and Japanese Unexamined Patent Application, First Publication No. 2001-223159 (corresponding to U.S. Pat. No. 6,498,350).

Moreover, as shown in FIG. 1 and FIG. 2, the first substrate stage 2 includes a first joint member 61 provided on the side face on the +Y side of the stage main-structure 21 and a second joint member 62 provided on the side face on the −Y side thereof. In the same manner, the second substrate stage 3 includes a third joint member 63 provided on the side face on the +Y side of the stage main-structure 31 and a fourth joint member 64 provided on the side face on the −Y side thereof.

Furthermore, the drive system 5 includes a joint member 53 provided on the slide member 51 and a joint member 54 provided on the slide member 52. The joint member 53 is provided on the −Y side of the slide member 51 so as to face the measurement station ST2 side (−Y side). The joint member 54 is provide on the +Y side of the slide member 52 so as to face the exposure station ST1 side (+Y side).

The slide member 51 and the joint member 53 are fixed, and movable together with each other. Moreover, slide member 52 and the joint member 54 are fixed, and movable together with each other. Consequently, the linear motors 12, 14, and 16 are movable together with the slide member 51 and the joint member 53, and the linear motors 13, 15, and 17 are movable together with the slide member 52 and the joint member 54.

To the joint member 53 provided on the slide member 51 is releasably and sequentially connected the first joint member 61 of the stage main-structure 21 and the third joint member 63 of the stage main-structure 31. To the joint member 54 provided on the slide member 52 is releasably and sequentially connected the second joint member 62 of the stage main-structure 21 and the fourth joint member 64 of the stage main-structure 31.

That is, to the joint member 53 provided on the slide member 51 is releasably and sequentially connected the stage main-structure 21 of the first substrate stage 2 and the stage main-structure 31 of the second substrate stage 3 via the first joint member 61 and the third joint member 63, and to the joint member 54 provided on the slide member 52 is releasably and sequentially connected the stage main-structure 21 of the first substrate stage 2 and the stage main-structure 31 of the second substrate stage 3 via the second joint member 62 and the fourth joint member 64.

In the following description, the joint member 53 which is releasably and sequentially connected with the stage main-structure 21 of the first substrate stage 2 and the stage main-structure 31 of the second substrate stage 3, and the slide member 51 fixed to the joint member 53 are collectively referred to as a first connection member 71 appropriately. In addition, the joint member 54 which is releasably and sequentially connected with the stage main-structure 21 of the first substrate stage 2 and the stage main-structure 31 of the second substrate stage 3, and the slide member 52 fixed to the joint member 54 are collectively referred to as a second connection member 72 appropriately.

Consequently, the linear motors 12, 14, and 16 are capable of moving the first connection member 71, and the linear motors 13, 15, and 17 move the second connection member 72.

In addition, as shown in FIG. 2, the exposure apparatus EX includes a first region AR1 and a second region AR2 set on the base member BR The first region AR1 includes a position facing the terminal optical element FL of the projection optical system PL, and is a region set on at least a part of the exposure station ST1. The second region AR2 is a region differing from the first region AR1, and is a region set on at least a part of the measurement station ST2.

The first substrate stage 2 is movable by the drive system 5 while holding the substrate P in the predetermined region on the base member BP including the first region AR1 and the second region AR2. In the same manner, the second substrate stage 3 is movable by the drive system 5 while holding the substrate P in the predetermined region on the base member BP including the first region AR1 and the second region AR2, independently from the first substrate stage 2.

A control apparatus 7 executes the release of the connection between the first connection member 71 and the first substrate stage 2 (or the second substrate stage 3), the release of the connection between the second connection member 72 and the second substrate stage 3 (or the first substrate stage 2), the connection between the first connection member 71 and the second substrate stage 3 (or the first substrate stage 2), and the connection between the second connection member 72 and the first substrate stage 2 (or the second substrate stage 3), on the base member BP at a predetermined timing. That is, the control apparatus 7 executes the exchanging operation of the first connection member 71 and the second connection member 72 with respect to the first substrate stage 2 and the second substrate stage 3, at a predetermined timing.

Moreover, the first connection member 71 can be alternately connected to the first joint member 61 of the stage main-structure 21 and the third joint member 63 of the stage main-structure 31, and the second connection member 72 can be alternately connected to the second joint member 62 of the stage main-structure 21 and the fourth joint member 64 of the stage main-structure 31. That is, the first connection member 71 is alternately connected to the stage main-structure 21 of the first substrate stage 2 and the stage main-structure 31 of the second substrate stage 3 via the first joint member 61 and the third joint member 63, and the second connection member 72 is alternately connected to the stage main-structure 21 of the first substrate stage 2 and the stage main-structure 31 of the second substrate stage 3 via the second joint member 62 and the fourth joint member 64.

The first connection member 71 is suitably constituted for moving the one substrate stage connected thereto among the first substrate stage 2 and the second substrate stage 3, in the first region AR1 (in the exposure station ST1). The second connection member 72 is suitably constituted for moving the other substrate stage connected thereto, in the second region AR2 (in the measurement station ST2). The first connection member 71 moves the one substrate stage connected thereto among the first substrate stage 2 and the second substrate stage 3, by the drive of the linear motors 12, 14, and 16. The second connection member 72 moves the other substrate stage connected thereto by the drive of the linear motors 13, 15, and 17.

Next is a description of an example of the measurement system 6 which measures the position information of the first substrate stage 2 and the second substrate stage 3, with reference to FIG. 1. Each of the first substrate table 22 of the first substrate stage 2 and the second substrate table 32 of the second substrate stage 3 has measurement mirrors 2Rx, 2Ry, and 2Rz or measurement mirrors 3Rx, 3Ry, and 3Rz to be irradiated with measuring light from the measurement system 6 for measuring the position of the first substrate table 22 and the second substrate table 32. The measurement system 6 is capable of measuring the position information of the first substrate tables 22 and the second substrate table 32 in relation to the directions of six degrees of freedom of the X axis, the Y axis, the Z axis, the θX, the θY, and the θZ directions, using the measurement mirrors 2Rx, 2Ry, and 2Rz or the measurement mirrors 3Rx, 3Ry, and 3Rz provided in predetermined positions on the first and second substrate tables 22 or 32.

The measurement mirrors 2Rx are arranged on the respective side faces on the +X side and the −X side of the first substrate table 22. The measurement mirrors 2Ry are arranged on the respective side faces on the +Y side and the −Y side of the first substrate table 22. The measurement mirrors 2Rz are arranged on the respective side faces on the +X side, the −X side, the +Y side and the −Y side of the first substrate table 22.

The measurement mirrors 3Rx are arranged on the respective side faces on the +X side and the −X side of the second substrate table 32. The measurement mirrors 3Ry are arranged on the respective side faces on the +Y side and the −Y side of the second substrate table 32. The measurement mirrors 3Rz are arranged on the respective side faces on the +X side, the −X side, the +Y side and the −Y side of the second substrate table 32.

The measurement system 6 has laser interferometers 6Px, 6Py, and 6Pz which respectively irradiate measuring light onto the measurement mirrors 2Rx, 2Ry, and 2Rz and the measurement mirrors 3Rx, 3Ry, and 3Rz provided in predetermined positions on the first substrate table 22 and the second substrate table 32 of the first substrate stage 2 and the second substrate stage 3, so as to measure the position information of the first substrate table 22 and the second substrate table 32. The laser interferometers 6Px, 6Py, and 6Pz are respectively provided at the exposure station ST1 or the measurement station ST2. The laser interferometers 6Px, 6Py, and 6Pz provided at the exposure station ST1 measure the position information of the first substrate table 22 (or the second substrate table 32) in the exposure station ST1. The laser interferometers 6Px, 6Py, and 6Pz provided at the measurement station ST2 measure the position information of the second substrate table 32 (or the first substrate table 22) in the measurement station ST2.

The laser interferometer 6Px is capable of irradiating measuring light having the X axis direction as a measurement axis onto the measurement mirrors 2Rx and 3Rx, so as to measure the position of the first substrate table 22 and the second substrate table 32 in relation to the X axis direction. The laser interferometer 6Py is capable of irradiating measuring light having the Y axis direction as a measurement axis onto the measurement mirrors 2Ry and 3Ry, so as to measure the position of the first substrate table 22 and the second substrate table 32 in relation to the Y axis direction.

The laser interferometer 6Pz is capable of irradiating measuring light having the Z axis direction as a measurement axis onto the measurement mirrors 2Rz and 3Rz, so as to measure the position of the first substrate table 22 and the second substrate table 32 in relation to the Z axis direction. The reflecting surface of the measurement mirrors 2Rz and 3Rz is inclined at a predetermined angle (such as 45 degrees) so as to face upward (+Z orientation). The measuring light that has been emitted from the laser interferometer 6Pz, and irradiated onto the measurement mirror 2Rz or 3Rz, is reflected on the reflecting surface of the measurement mirror 2Rz or 3Rz, and irradiated onto measurement mirrors 2K or 3K provided on a predetermined supporting frame 19. Then, the measuring light that has been reflected by the measurement mirrors 2K or 3K is received by the laser interferometer 6Pz via the measurement mirror 2Rz or 3R of the first substrate table 22 and the second substrate table 32. The laser interferometer 6Pz is capable of measuring the position information of the first substrate table 22 and the second substrate table 32 in the Z axis direction, using the received measuring light. The technique regarding the laser interferometer (Z interferometer) 6Pz capable of measuring the position information of the first substrate table 22 and the second substrate table 32 in the Z axis direction, is disclosed in for example in Japanese Unexamined Patent Application, First Publication No. 2000-323404 (corresponding to U.S. Pat. No. 7,116,401), and Published Japanese Translation No. 2001-513267 of PCT International Publication (corresponding to U.S. Pat. No. 6,208,407).

In addition, by providing a plurality of at least one of the laser interferometers 6Px or the laser interferometers 6Py, and irradiating a plurality of at least one of the measuring lights having the X axis direction as the measurement axis or the measuring lights having the Y axis direction as the measurement axis, the measurement system 6 is capable of measuring the position information of the first substrate table 22 and the second substrate table 32 in the θZ direction, using the plurality of the measuring lights. By providing a plurality of the laser interferometers 6Pz, and irradiating a plurality of the measuring lights having the Z axis direction as the measurement axis, the measurement system 6 is capable of measuring the position information of the first substrate table 22 and the second substrate table 32 in the θX and the θY direction, using a plurality of the measuring lights.

In the following description, the laser interferometers 6Px, 6Py, and 6Pz are respectively referred to as an X interferometer 6Px, a Y interferometer 6Py, and a Z interferometer 6Pz.

The measurement system 6 has a focus leveling detection system 6F which is arranged at the measurement station ST2 and detects the surface position information of the surface of the substrate P held on the first substrate table 22 or the second substrate table 32 (position information in relation to the Z axis, the θX, and the θY directions). The focus leveling detection system 6F alternately detects the surface position information of the surface of the substrate P held on the first substrate table 22, and the surface position information of the surface of the substrate P held on the second substrate table 32, in the measurement station ST2. Moreover, the measurement system 6 has a mark detection system (not shown) which is arranged in the measurement station ST2, and is capable of detecting an alignment mark of the substrate P or a reference mark arranged on the top face 25 or 35 of the first substrate table 22 or the second substrate table 32.

The control apparatus 7 drives the drive system 5 based on the measured result of the measurement system 6 to control the position of the first substrate table 22 or the second substrate table 32, and thereby controls the position of the substrate P held by the substrate holder 23 or 33 of the first substrate table 22 or the second substrate table 32.

In the exposure station ST1 are provided the projection optical system PL, the nozzle member 8, and the like. In the exposure station ST1, the substrate P is exposed via the projection optical system PL and the liquid LQ. In the measurement station ST2 are provided measurement systems such as a focus leveling detection system 6F which measure the exposure of the substrate P, and a mark detection system. In the measurement station ST2, the measurement related to the exposure is performed and the substrate P is exchanged. The first substrate stage 2 and the second substrate stage 3 are respectively movable between the first region AR1 in the exposure station ST1 and the second region AR2 in the measurement station ST2 while holding the substrate P.

Moreover, as shown in FIG. 2, in the vicinity of the measurement station ST2 is provided a conveyance system H for exchanging the substrate P. The control apparatus 7 can perform the substrate exchanging operation of unloading (carrying out) the substrate P that has been exposure treated from the first substrate stage 2 (or the second substrate stage 3) moved to the substrate exchanging position (loading position) RP in the measurement station ST2, and loading (carrying in) the substrate P to be exposure treated into the first substrate stage 2 (or the second substrate stage 3), using the conveyance system H.

Figure 3:
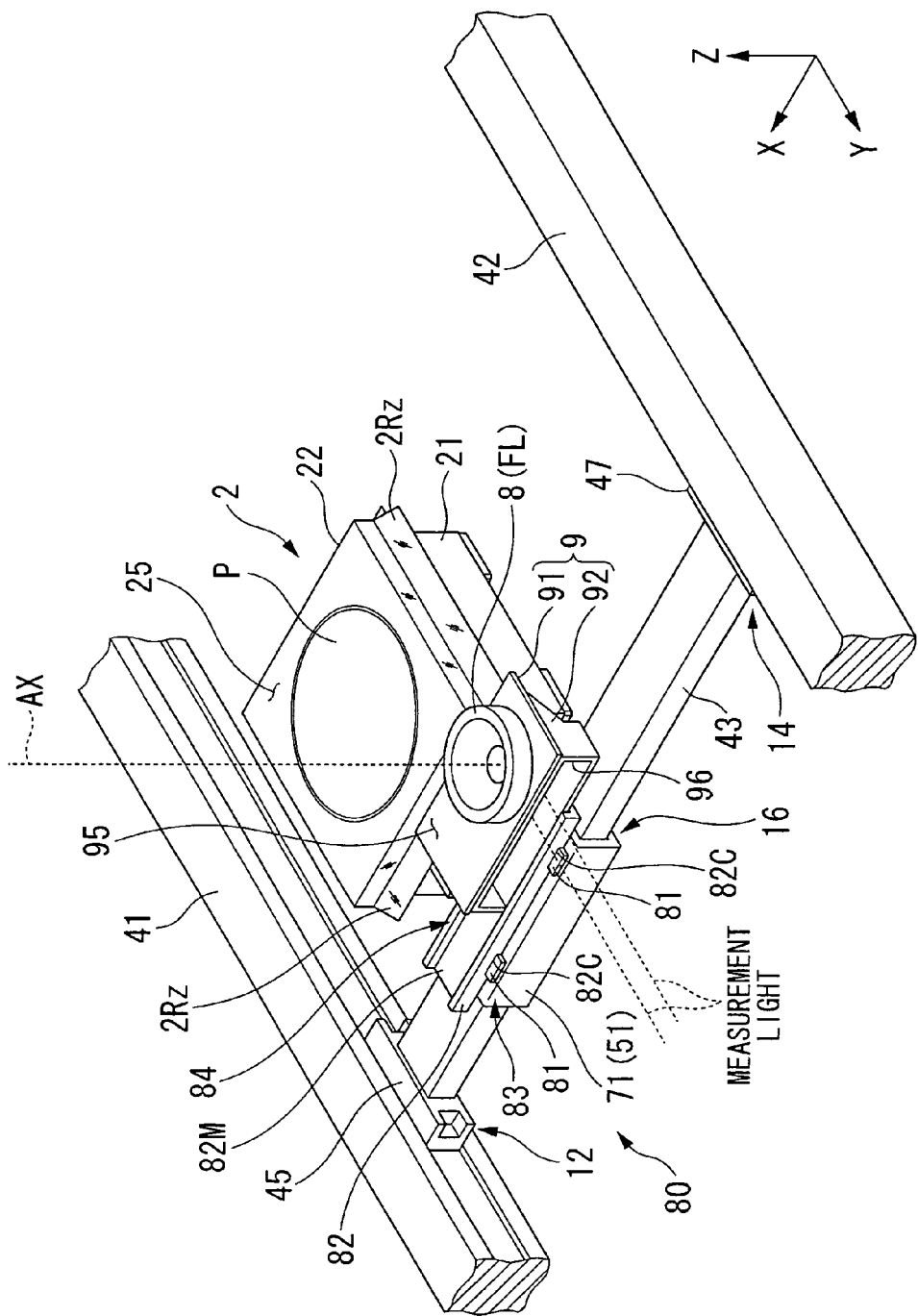
FIG. 3 is a perspective view showing the vicinity of an auxiliary table.
Figure 4:
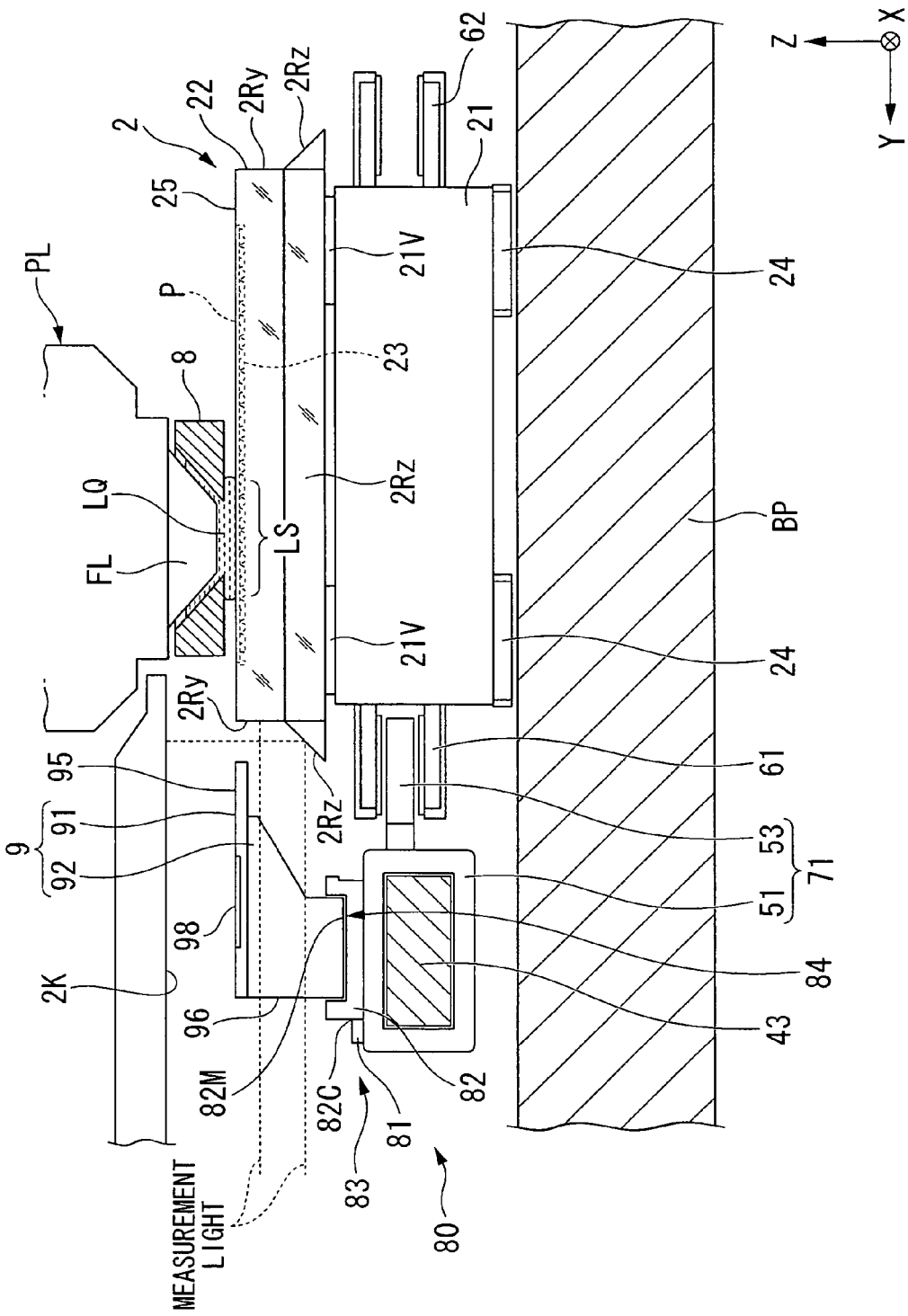
FIG. 4 is a side view showing the vicinity of the auxiliary table.
Figure 5:
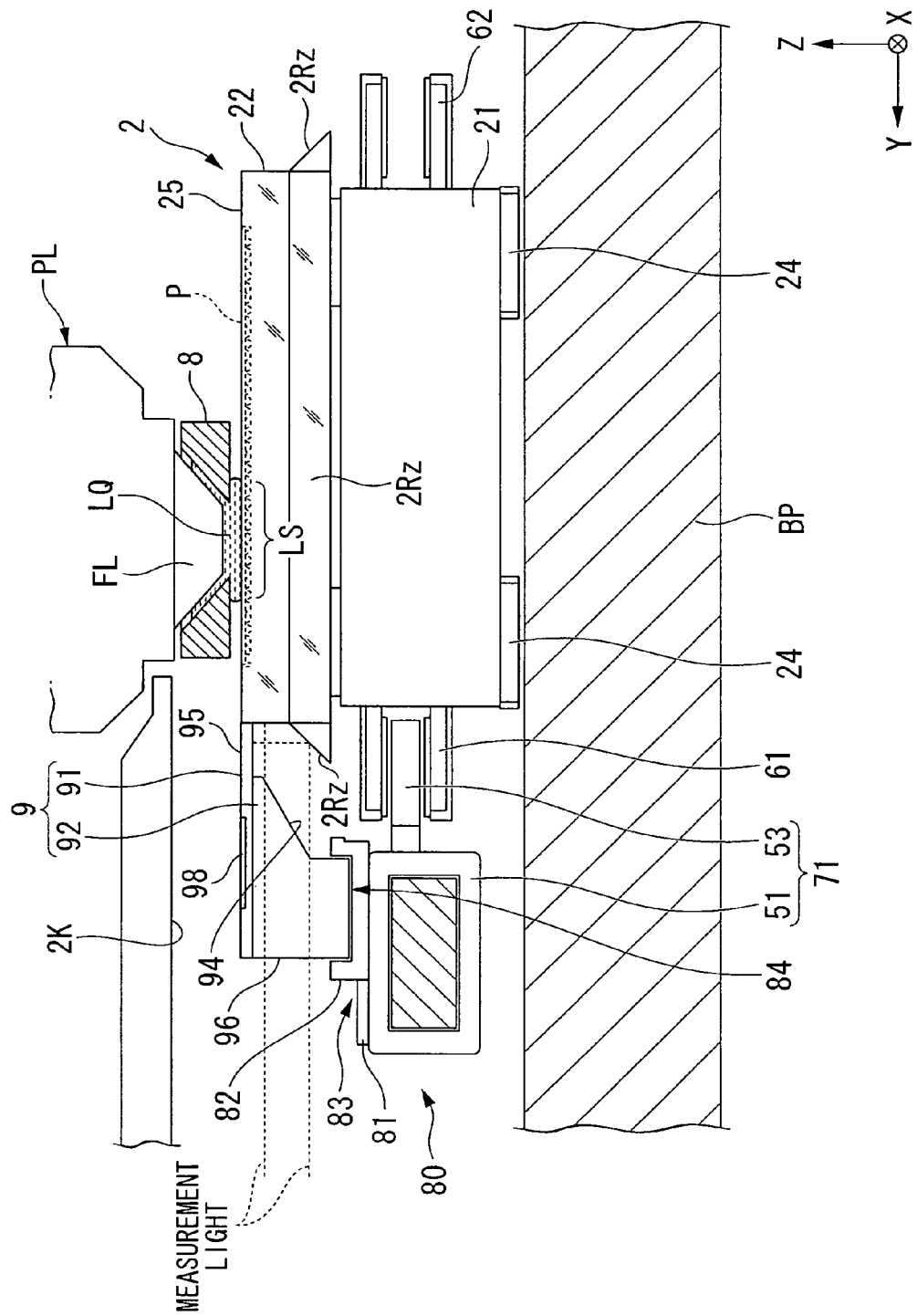
FIG. 5 is a side view showing the vicinity of the auxiliary table.

Next is a description of the auxiliary table 9. FIG. 3 is a perspective view showing the vicinity of the auxiliary table 9. FIG. 4 and FIG. 5 are side views showing the vicinity of the auxiliary table 9. FIG. 3, FIG. 4, and FIG. 5 show a state where the first connection member 71 is connected with the first substrate stage 2. In the following description using FIG. 3, FIG. 4, and FIG. 5, the explanation is performed by illustrating the case where the first connection member 71 is connected with the first substrate stage 2. However, as described above, the first connection member 71 may be connected with the second substrate stage 3, and the first substrate stage 2 and the second substrate stage 3 have substantially the same structure. Therefore, the same explanation is also applicable to the case where the first connection member 71 is connected with the second substrate stage 3.

The auxiliary table 9 is provided on the slide member 51 of the first connection member 71, and is movable on the light emitting side of the terminal optical element FL, and is movable to the position facing the nozzle member 8 and the terminal optical element FL. As described above, the joint member 53 of the first connection member 71 is provided on the side face of the −Y side (measurement station ST2 side) of the slide member 51, and the first substrate stage 2 is arranged at the −Y side of the slide member 51 (first connection member 71). Consequently, the auxiliary table 9 is arranged at the +Y side of the first substrate stage 2.

The auxiliary table 9 is capable of holding the liquid LQ between the nozzle member 8 and the terminal optical element FL by being moved to the position facing the nozzle member 8 and the terminal optical element FL. The auxiliary table 9 has a substantially flat top face 95, and is capable of forming the immersion space LS of the liquid LQ between the nozzle member 8, the terminal optical element FL, and the top face 95, by facing the top face 95 to the nozzle member 8 and the terminal optical element FL.

The auxiliary table 9 has a plate member 91 and a support member 92 which supports the plate member 91, and is capable of holding the liquid LQ between the top face 95 of the auxiliary table 9 (plate member 91), the nozzle member 8, and the terminal optical element FL.

The auxiliary table 9 is movable with respect to the first connection member 71 (slide member 51). In the present embodiment, the exposure apparatus EX includes a driving mechanism 80 for moving the auxiliary table 9 with respect to the first connection member 71. At least a part of the driving mechanism 80 is arranged on the slide member 51 of the first connection member 71.

The driving mechanism 80 is arranged on the top face of the slide member 51, and includes a pair of Y axis guide members 81 extending in the Y axis direction, and X axis guide members 82 movably (slidably) supported on the Y axis guide members 81 in the Y axis direction, and movably (slidably) supporting the auxiliary table 9 in the X axis direction. The X axis guide member 82 is arranged on the Y axis guide member 81. The Y axis guide member 81 movably supports the X axis guide member 82 in the Y axis direction. The X axis guide member 82 is movable along the Y axis guide member 81 in the Y axis direction.

Each Y axis guide member 81 includes a magnet unit having a plurality of permanent magnets. On the bottom face of the X axis guide member 82 facing the Y axis guide member 81 is formed a recessed portion 82C corresponding to the Y axis guide member 81. In the recessed portion 82C is arranged a coil unit having an armature coil. That is, in the present embodiment, the moving coil type Y axis linear motor 83 is formed by the X axis guide members 82 having a coil unit and the Y axis guide members 81 having a magnet unit. The X axis guide member 82 is moved by the Y axis linear motor 83, along the Y axis guide member 81 in the Y axis direction.

The auxiliary table 9 is arranged on the X axis guide members 82, and the X axis guide members 82 movably support the auxiliary table 9. The auxiliary table 9 is movable along the X axis guide members 82 in the X axis direction.

On the bottom face of the auxiliary table 9 facing the X axis guide member 82 is arranged a magnet unit having a plurality of permanent magnets. On the top face of the X axis guide member 82 facing the auxiliary table 9 is formed a guide groove 82M extending in the X axis direction. In the guide groove 82M is arranged a coil unit having an armature coil. That is, in the present embodiment, the moving magnet type X axis linear motor 84 is formed by the auxiliary table 9 having a magnet unit and the X axis guide members 82 having a coil unit. The auxiliary table 9 is moved by the X axis linear motor 84, along the X axis guide member 82 in the X axis direction.

The auxiliary table 9 is movable in the X axis direction on the X axis guide members 82 by the drive of the X axis linear motor 84. When the X axis guide members 82 are moved on the Y axis guide members 81 in the Y axis direction by the drive of the Y axis linear motor 83, the auxiliary table 9 is moved in the Y axis direction together with the X axis guide members 82. In this manner, the driving mechanism 80 is capable of moving the auxiliary table 9 on the first connection member 71 (slide member 51) in two dimensional directions of the X axis direction and the Y axis direction. That is, the driving mechanism 80 can move the auxiliary table 9 substantially parallel to the top face 95 of the plate member 91. The control apparatus 7 is capable of adjusting the positional relationship of the auxiliary table 9 and the first substrate stage 2 connected to the first connection member 71, by driving the driving mechanism 80 to move the auxiliary table 9 with respect to the first connection member 71.

Moreover, for example, between the support member 92 and the plate member 91 may be arranged a plurality of actuators such as a voice coil motor. The control apparatus 7 is capable of moving the plate member 91 with respect to the support member 92 in the Z axis, the θX, and the θY directions, by adjusting the drive amount of a plurality of the respective actuators interposed between the support member 92 and the plate member 91. Moreover, the actuators may move the plate member 91 in the θZ direction with respect to the support member 92. That is, the driving mechanism 80 may move the plate member 91 having the top face 95 in directions of six degrees of freedom with respect to the first connection member 71.

As described above, the driving mechanism 80 is capable of moving the auxiliary table 9 on the first connection member 71 with respect to the first substrate stage 2 connected to the first connection member 71 independently. As shown in FIG. 4, the control apparatus 7 can move the auxiliary table 9 using the driving mechanism 80 so that the auxiliary table 9 and the first substrate stage 2 (first substrate table 22) connected to the first connection member 71 are separated by a predetermined distance. In addition, as shown in FIG. 5, the control apparatus 7 can move the auxiliary table 9 using the driving mechanism 80 so that the auxiliary table 9 and the first substrate stage 2 (first substrate table 22) connected to the first connection member 71 are brought close to or into contact with each other. When the auxiliary table 9 and the first substrate table 22 are brought close to or into contact with each other, the first substrate table 22 may be moved using the fine movement system 11 jointly, or using the fine movement system 11 only. Moreover, if only the fine movement system 11 is used for bringing the auxiliary table 9 and the first substrate table 22 close to or into contact with each other, the auxiliary table 9 may be constituted so as to be moved not in the Y axis direction but in the X axis direction only, with respect to the first connection member 71.

Moreover, as described above, the top face 95 of the auxiliary table 9 is substantially flat and the top face 25 of the first substrate stage 2 is also substantially flat. Consequently, as shown in FIG. 5, the control apparatus 7 moves the auxiliary table 9 using the driving mechanism 80 so that the top face 95 of the auxiliary table 9 and the top face 25 of the first substrate stage 2 connected to the first connection member 71 are brought close to or into contact with each other, and the top face 95 of the auxiliary table 9 and the top face 25 of the first substrate stage 2 are substantially flush. That is, the control apparatus 7 can control the driving mechanism 80 so as to arrange the top face 95 of the auxiliary table 9 and the top face 25 of the first substrate stage 2 in the same plane (XY plane). When the top face 95 of the auxiliary table 9 and the top face 25 of the first substrate table 22 are arranged to form a substantially same plane, the first substrate table 22 may be moved using the fine movement system 11 jointly, or using the fine movement system 11 only.

Moreover, in the present embodiment, an encoder system (not shown) capable of measuring the position of the auxiliary table 9 is arranged, and the control apparatus 7 can control the driving mechanism 80 to move the auxiliary table 9 to a desired position based on the measured results of the encoder system.

As shown in FIG. 4 and FIG. 5, in the present embodiment, on the side faces of the first substrate table 22 are arranged the measurement mirrors 2Rz so as to project from the side faces. As described above, the measurement mirrors 2Rz are arranged on the respective side faces on the +X side, the −X side, the +Y side, and the −Y side of the first substrate table 22. In this case, when the top face 95 of the auxiliary table 9 is brought close to or into contact with the top face 25 of the first substrate stage 2, there is a possibility that the auxiliary table 9 and the measurement mirror 2Rz are in contact (collision) with each other. Therefore, in the present embodiment, when the top face 95 of the auxiliary table 9 is brought close to or into contact with the top face 25 of the first substrate stage 2, in order to avoid the contact (collision) of the auxiliary table 9 and the measurement mirror 2Rz, at least a part of the auxiliary table 9 facing the measurement mirror 2Rz is concaved so as to be separated from the measurement mirror 2Rz (first substrate stage 2). As shown in FIG. 5, in the present embodiment, by arranging a part of the plate member 91 so as to project to the first substrate stage 2 side from the support member 92, a recessed portion 94 for suppressing contact with the measurement mirror 2Rz is formed in the auxiliary table 9.

Moreover, there is a possibility that at least a part of the auxiliary table 9 is arranged in a position facing the measurement mirrors 2Ry and 2Rz of the first substrate stage 2. However in the present embodiment, the auxiliary table 9 has an aperture 96 for passing the measuring light from the laser interferometer 6Py or 6Pz in the measurement system 6. As a result, the measurement system 6 can control the position of the first substrate stage 2 connected to the first connection member 71.

Furthermore, in the present embodiment, the auxiliary table 9 has a measuring instrument 98. The measuring instrument 98 provided on the auxiliary table 9 includes measuring instruments capable of measuring the intensity (permeability) of exposure light EL, for example as disclosed in PCT International Publication No. WO2005/074014 (corresponding to U.S. patent application, Publication No. 2007/0127006) and PCT International Publication No. WO2006/013806 (corresponding to European Patent Application Publication No. 1,791,164).

The auxiliary table 9 may be arranged with other measuring instruments such as a measuring instrument for detecting the image of a space formed via the projection optical system PL and the liquid LQ.

Next is a description of an example of the operation of the exposure apparatus having the above structure, with reference to FIG. 6 to FIG. 9.

In the present embodiment, while one of the first substrate stage 2 and the second substrate stage 3 is used to perform an exposure process of the substrate P held on the one substrate stage in the exposure station ST1, the other substrate stage is used to execute a predetermined treatment in the measurement station ST2.

Specifically, in the state where the optical path space of exposure light EL is filled with the liquid LQ, while the control apparatus 7 controls the movement of one substrate stage in the exposure station ST1 among the first substrate stage 2 and the second substrate stage 3, the substrate P held on the substrate stage is exposed via the projection optical system PL and the liquid LQ. On the other hand, the control apparatus 7 measures the position information of the unexposed substrate P held on the other substrate stage in the measurement station ST2. Here, the position information (position information in the Z axis, the θX axis, and the θY directions) of the substrate P includes at least one of the surface position information of the surface of the substrate P with respect to a predetermined reference plane, and the alignment information (position information of a plurality of shot regions in the Z axis, the θX axis, and the θY directions on the substrate P) of the substrate P with respect to a predetermined reference position.

The control apparatus 7 starts the exchange (loading and/or unloading) of the substrate P and a predetermined measurement process, in the measurement station ST2. The control apparatus 7 arranges the second substrate stage 3 in the substrate exchanging position RP in the measurement station ST2, and loads the substrate P to be exposure treated into the second substrate stage 3 using the conveyance system H. Then, the control apparatus 7 starts the measurement process regarding the second substrate stage 3 holding the substrate P in the measurement station ST2. On the other hand, in the exposure station ST1, the substrate P is already loaded and the first substrate stage 2 holding the substrate P is arranged, so that the exposure of the substrate P that has been applied with the measurement process in the measurement station ST2 is started.

Figure 6:
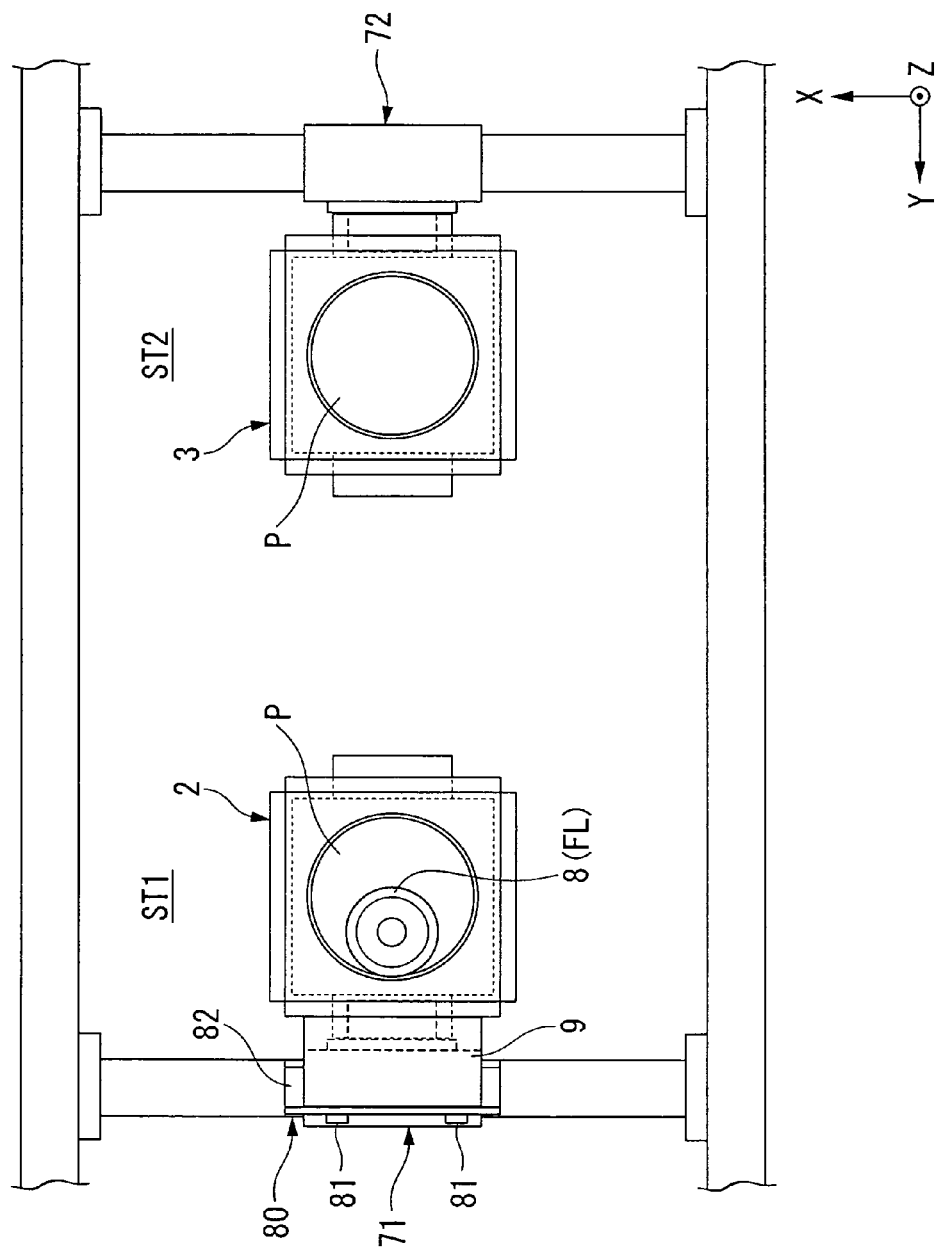
FIG. 6 is a diagram for explaining an exposure method according to the present embodiment.

As shown in FIG. 6, the control apparatus 7 moves the first connection member 71 connected to the first substrate stage 2 using the drive system 5, in the exposure station ST1, and thereby moves the first substrate stage 2, so as to execute the exposure process of the substrate P held on the first substrate stage 2. Moreover, the control apparatus 7 moves the second connection member 72 connected to the second substrate stage 3 using the drive system 5, in the measurement station ST2, and thereby moves the second substrate stage 3, so as to execute the measurement process of the substrate P held on the second substrate stage 3, concurrently with at least a part of the exposure process of the substrate P held on the first substrate stage 2.

The control apparatus 7 executes the immersion exposure of the substrate P held on the first substrate stage 2, in the exposure station ST1. The control apparatus 7 exposes the substrate P in a state where the optical path space of exposure light EL on the light emitting side of the terminal optical element FL is filled with the liquid LQ, while the terminal optical element FL and the first substrate stage 2 holding the substrate P are opposed.

While the exposure process using the first substrate stage 2 is executed in the exposure station ST1, the measurement process or the like using the second substrate stage 3 is executed in the measurement station ST2. In the present embodiment, the measurement in the measurement station ST2 includes the detection operation using the focus leveling detection system 6F and the mark detection system described above. For example, in the detection operation using the focus leveling detection system 6F, the control apparatus 7 measures the position information of the second substrate stage 3 in the Z axis direction, by the Z interferometer 6Pz in the measurement station ST2, while detecting the surface position information of a predetermined reference plane and the surface of the substrate P using the focus leveling detection system 6F. Then, the control apparatus 7 obtains the approximate plane (approximate surface) of the respective shot regions on the surface of the substrate P, based on the reference plane.

Moreover, in the detection operation using the mark detection system, the control apparatus 7 measures the position information of the second substrate stage 3 holding the substrate P in the X axis and Y axis directions, by the X interferometer 6Px and the Y interferometer 6Py in the measurement station ST2, while detecting the reference mark formed on a part of the second substrate stage 3 and the alignment mark provided on the substrate P so as to correspond to the respective shot regions on the substrate P, using the mark detection system. Then, the control apparatus 7 obtains the position information of a plurality of the respective shot regions on the substrate P, with respect to the predetermined reference position.

Figure 7:
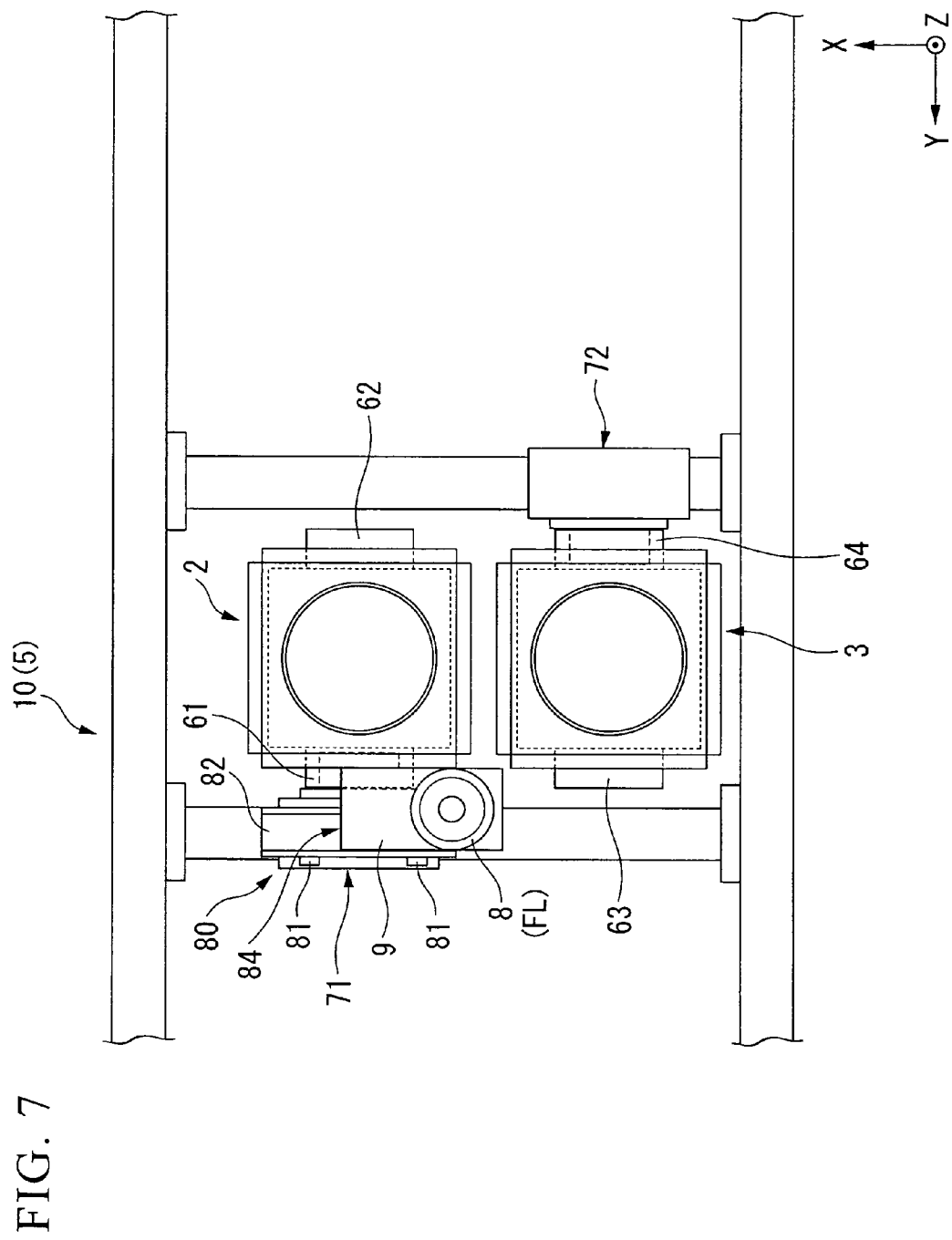
FIG. 7 is a diagram for explaining an exposure method according to the present embodiment.

After the immersion exposure of the substrate P held on the first substrate stage 2 is completed and the measurement process of the substrate P held on the second substrate stage 3 is completed, the control apparatus 7 controls the drive system 5 and the driving mechanism 80 so that, as shown in FIG. 7, the terminal optical element FL and the auxiliary table 9 are opposed. As a result, the liquid LQ held between the first substrate stage 2 and the terminal optical element FL is held between the auxiliary table 9 and the terminal optical element FL. That is, while the state is kept where the liquid LQ is existed in a space on the light emitting side of the terminal optical element EL, the state where the first substrate stage 2 and the terminal optical element FL are opposed is changed into the state where the auxiliary table 9 and the terminal optical element FL are opposed.

In order to change from the state where the first substrate stage 2 and the terminal optical element FL are opposed (the state where the liquid LQ is held between the first substrate stage 2 and the terminal optical element FL), to the state where the auxiliary table 9 and the terminal optical element FL are opposed (the state where the liquid LQ is held between the auxiliary table 9 and the terminal optical element FL), as described with reference to FIG. 5, the control apparatus 7 controls the driving mechanism 80 to move the auxiliary table 9 with respect to the first substrate stage 2 connected to the first connection member 71 so as to bring the first substrate stage 2 and the auxiliary table 9 close to or in contact with each other. At this time, the control apparatus 7 controls the driving mechanism 80 so that the top face 25 of the first substrate stage 2 and the top face 95 of the auxiliary table 9 are substantially flush. The top face 25 of the first substrate stage 2 has a linear edge extending in the X axis direction, and the top face 95 of the auxiliary table 9 also has a linear edge extending in the X axis direction. By closeness or contact of these edges with each other, the top face 25 of the first substrate stage 2 and the top face 95 of the auxiliary table 9 are arranged to form a substantially continuous plane. Then, in the state where the first substrate stage 2 and the auxiliary table 9 are close to or in contact with each other, the control apparatus 7 controls the drive system 5 to simultaneously move the first substrate stage 2 and the auxiliary table 9. At this time, while maintaining the state where the top face 25 of the first substrate stage 2 and the top face 95 of the auxiliary table 9 are substantially flush, the control apparatus 7 simultaneously moves the first substrate stage 2 and the auxiliary table 9. As a result, in the state where the immersion space LS of the liquid LQ is formed, while the leakage of the liquid LQ is suppressed, it is possible to smoothly change from the state where the liquid LQ is held between the first substrate stage 2 and the terminal optical element FL, to the state where the liquid LQ is held between the auxiliary table 9 and the terminal optical element FL. That is, in the state where the optical path space of exposure light EL on the light emitting side of the terminal optical element FL is kept filled with the liquid LQ, it is possible to change from the state where the first substrate stage 2 and the terminal optical element FL are opposed, to the state where the auxiliary table 9 and the terminal optical element FL are opposed.

Moreover, as shown in FIG. 7, in the state where the auxiliary table 9 and the terminal optical element FL are opposed, the control apparatus 7 controls the drive system 5 to move the first substrate stage 2 and the second substrate stage 3 so that the first substrate stage 2 and the second substrate stage 3 are aligned in the X axis direction. In the present embodiment, as shown in FIG. 7, the first substrate stage 2 is arranged on the +X side of the second substrate stage 3.

Furthermore, in the case where the first substrate stage 2 and the first connection member 71 connected to the first substrate stage 2 are moved, the control apparatus 7 moves the driving mechanism 80 according to the movement of the first connection member 71 so as to keep the state where the auxiliary table 9 and the terminal optical element FL are opposed. In the present embodiment, in FIG. 7, the control apparatus 7 controls the X axis linear motor 84 of the driving mechanism 80 so that the auxiliary table 9 is moved on the X guide member 82 in the −X direction.

Figure 8:
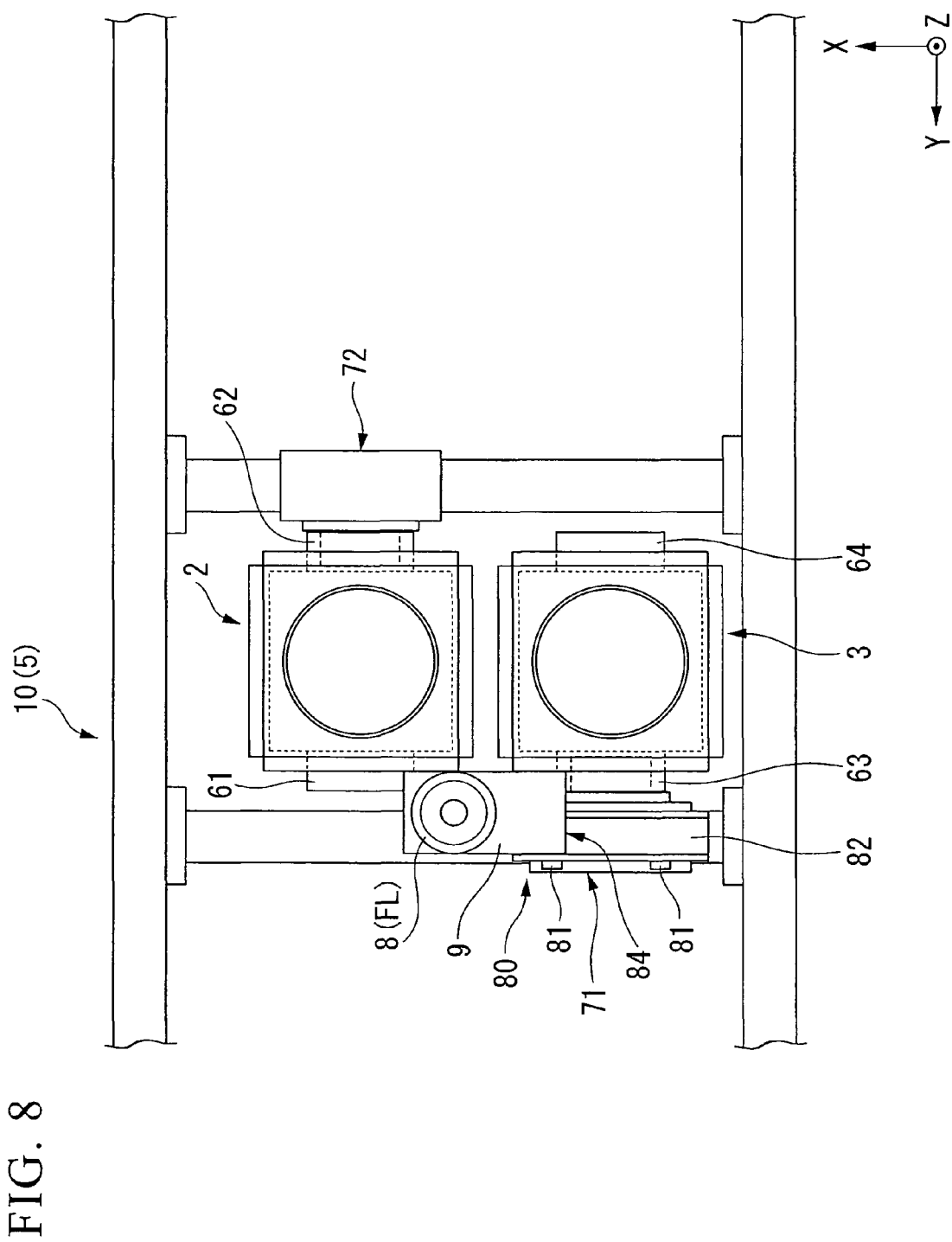
FIG. 8 is a diagram for explaining an exposure method according to the present embodiment.

Next, as shown in FIG. 8, while maintaining the state where the auxiliary table 9 and the terminal optical element FL are opposed, the control apparatus 7 executes the exchanging operation of the first connection member 71 and the second connection member 72 with respect to the first substrate stage 2 and the second substrate stage 3. That is, the control apparatus 7 cancels the connection between the first connection member 71 and the first joint member 61 of the first substrate stage 2 so as to release the first substrate stage 2 from the first connection member 71, and cancels the connection between the second connection member 72 and the fourth joint member 64 of the second substrate stage 3 so as to release the second substrate stage 3 from the second connection member 72. Then, the control apparatus 7 moves the first connection member 71 in the −X direction, to connect to the third joint member 63 of the second substrate stage 3, and moves the second connection member 72 in the +X direction to connect to the second joint member 62 of the first substrate stage 2.

In this manner, in the exchanging operation, the first connection member 71 that has been connected to the first substrate stage 2 is connected to the second substrate stage 3, and the second connection member 72 that has been connected to the second substrate stage 3 is connected to the first substrate stage 2.

In the case where the first connection member 71 is moved for the exchanging operation between the first connection member 71 and the second connection member 72, the control apparatus 7 moves the auxiliary table 9 with respect to the first connection member 71 by the driving mechanism 80 according to the movement of the first connection member 71 so as to keep the state where the auxiliary table 9 and the terminal optical element FL are opposed. In the present embodiment, as shown in FIG. 8, the control apparatus 7 controls the X axis linear motor 84 of the driving mechanism 80 so that, when the first connection member 71 moves in the −X direction, the liquid LQ is kept to be held between the auxiliary table 9 and the terminal optical element FL and the auxiliary table 9 is moved on the X axis guide member 82 in the +X direction.

As described above, during the exchanging operation period between the first connection member 71 and the second connection member 72, the state where the auxiliary table 9 and the terminal optical element FL are opposed, is maintained. When the terminal optical element FL and the auxiliary table 9 are opposed, the control apparatus 7 irradiates exposure light EL onto the measuring instrument 98 of the auxiliary table 9 via the liquid LQ held between the terminal optical element FL and the auxiliary table 9. At least a part of the exposure light EL is incident into the measuring instrument 98 via the liquid LQ. The measuring instrument 98 measures (receives) the exposure light EL.

The control apparatus 7 is capable of adjusting the exposure condition based on the measured result (light receipt result) of the measuring instrument 98. For example, in the case where the measuring instrument 98 is a measuring instrument which measures the intensity of exposure light EL, based on the measured result of the measuring instrument 98, the control apparatus 7 calibrates the optical system such as the illumination optical system IL and the projection optical system PL, and calibrates the state of the liquid LQ, so that exposure light EL having a desired intensity is irradiated via the liquid LQ. The control apparatus 7 is capable of executing the measurement operation by means of the measuring instrument 98, and the calibration operation based on the measured result, in parallel with at least a part of the exchanging operation between the first connection member 71 and the second connection member 72.

Figure 9:
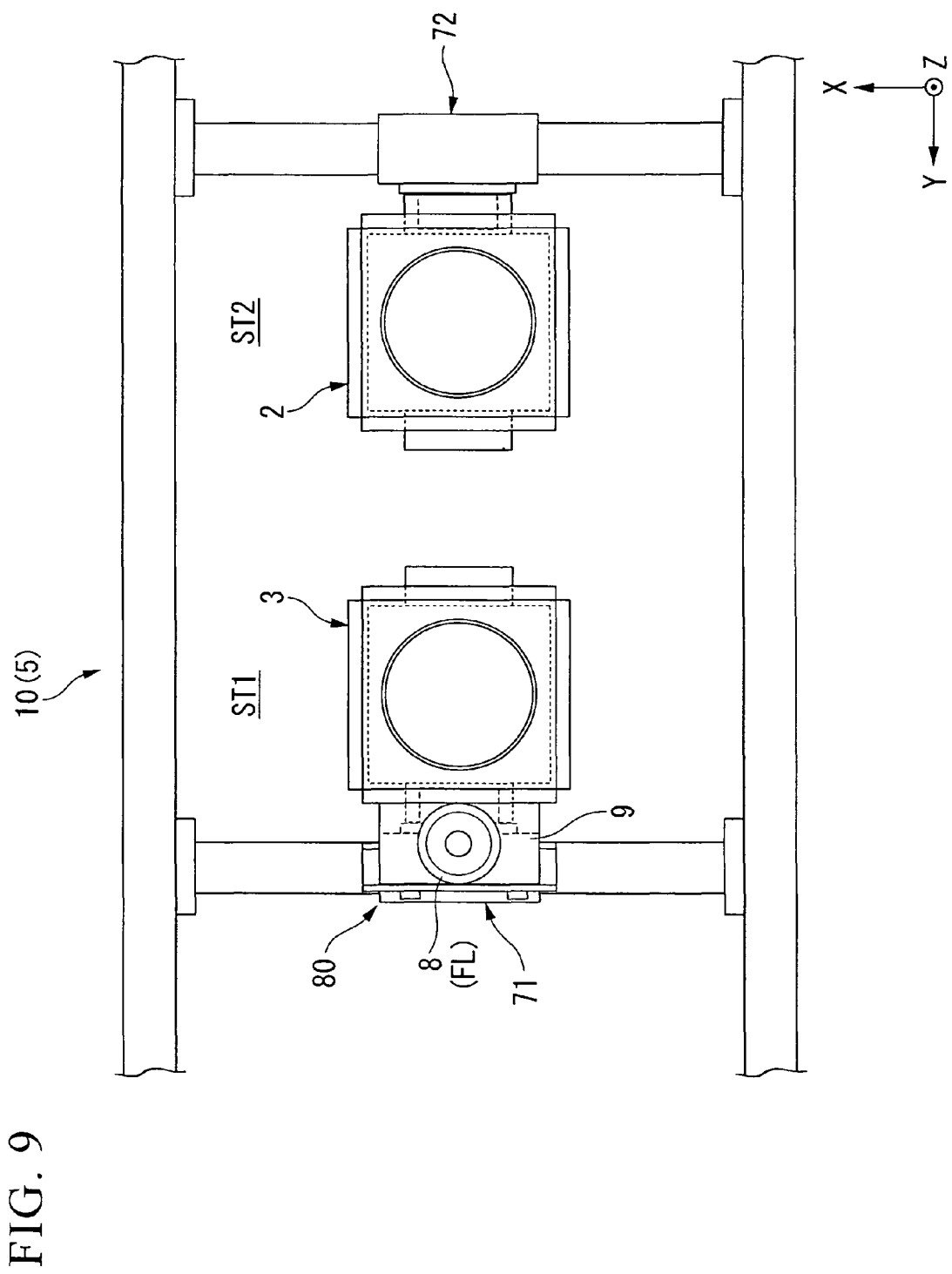
FIG. 9 is a diagram for explaining an exposure method according to the present embodiment.

Thereafter, as shown in FIG. 9, while maintaining the state where the auxiliary table 9 and the terminal optical element FL are opposed, the control apparatus 7 controls the drive system 5 to move the first substrate stage 2 connected to the second connection member 72 to the measurement station ST2, and controls the drive system 5 and the drive mechanism 80 to relatively move the first connection member 71 (second substrate stage 3) and the auxiliary table 9 so that the second substrate stage 3 connected to the first connection member 71 and the auxiliary table 9 are aligned in the Y axis direction.

The substrate P held on the first substrate stage 2 that has been moved to the measurement station ST2, is unloaded by the conveyance system H in the substrate exchanging position RP, and a new substrate P to be exposed is loaded on the first substrate stage 2. The control apparatus 7 starts the measurement process of the substrate P loaded on the first substrate stage 2, in the measurement station ST2.

Figure 10:
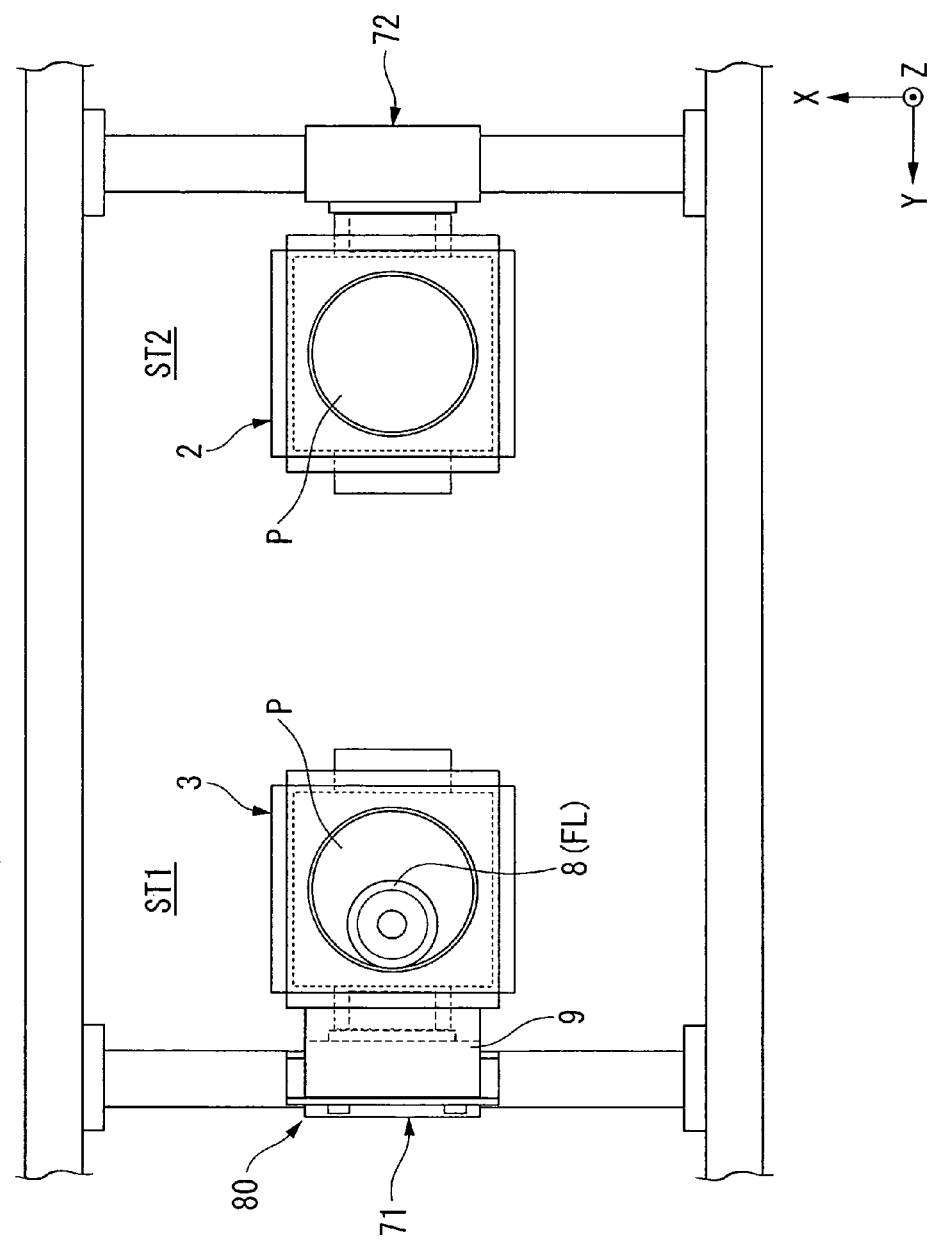
FIG. 10 is a diagram for explaining an exposure method according to the present embodiment.

On the other hand, as shown in FIG. 10, the control apparatus 7 controls the drive system 5 and the driving mechanism 80 to oppose the terminal optical element FL and the second substrate stage 3, in the exposure station. As a result, the liquid LQ that has been held between the auxiliary table 9 and the terminal optical element FL is held between the second substrate stage 3 and the terminal optical element FL.

In order to change from the state where the auxiliary table 9 and the terminal optical element FL are opposed (the state where the liquid LQ is held between the auxiliary table 9 and the terminal optical element FL), to the state where the second substrate stage 3 and the terminal optical element FL are opposed (the state where the liquid LQ is held between the second substrate stage 3 and the terminal optical element FL), firstly the control apparatus 7 controls the driving mechanism 80 to move the auxiliary table 9 with respect to the second substrate stage 3 so as to bring the second substrate stage 3 and the auxiliary table 9 close to or in contact with each other. At this time, the control apparatus 7 controls the driving mechanism 80 so that the top face 35 of the second substrate stage 3 and the top face 95 of the auxiliary table 9 are substantially flush. The top face 35 of the second substrate stage 3 has a linear edge extending in the X axis direction, and the top face 95 of the auxiliary table 9 also has a linear edge extending in the X axis direction. By closeness or contact of these edges with each other, the top face 35 of the second substrate stage 3 and the top face 95 of the auxiliary table 9 are arranged to form a substantially continuous plane. Then, in the state where the second substrate stage 3 and the auxiliary table 9 are close to or in contact with each other, the control apparatus 7 controls the drive system 5 to simultaneously move the second substrate stage 3 and the auxiliary table 9. At this time, while maintaining the state where the top face 35 of the second substrate stage 3 and the top face 95 of the auxiliary table 9 are substantially flush, the control apparatus 7 simultaneously moves the second substrate stage 3 and the auxiliary table 9. As a result, without recovering the liquid LQ, while the leakage of the liquid LQ is suppressed, it is possible to smoothly change from the state where the liquid LQ is held between the auxiliary table 9 and the terminal optical element FL, to the state where the liquid LQ is held between the second substrate stage 3 and the terminal optical element FL. That is, in the state where the optical path space of exposure light EL on the light emitting side of the terminal optical element FL is kept filled with the liquid LQ, it is possible to change from the state where the auxiliary table 9 and the terminal optical element FL are opposed, to the state where the second substrate stage 3 and the terminal optical element FL are opposed. When the auxiliary table 9 and the second substrate table 32 are relatively moved, the second substrate table 32 may be moved using the fine movement system 11 jointly. Moreover, when the top face 95 of the auxiliary table 9 and the top face 35 of the second substrate table 32 are relatively moved, the second substrate table 32 may be moved using the fine movement system 11 jointly.

Then, the control apparatus 7 executes the immersion exposure of the substrate P held on the second substrate stage 3, in the exposure station ST1. The control apparatus 7 exposes the substrate P in a state where the optical path space of exposure light EL on the light emitting side of the terminal optical element FL is filled with the liquid LQ, while the terminal optical element FL and the second substrate stage 3 holding the substrate P are opposed.

When the substrate P is to be exposed, while adjusting the position of the substrate P held on the second substrate stage 3 in the exposure station ST1 using the measured result, in the measurement station ST2, the control apparatus 7 exposes the substrate P.

Hereinafter, the process described with reference to FIG. 6 to FIG. 10 is repeated. That is, after the exposure process of the substrate P held on the second substrate stage 3 in the exposure station ST1, and the measurement process of the substrate P held on the first substrate stage 2 in the measurement station ST2 are completed, the state where the second substrate stage 3 and the terminal optical element FL are opposed is changed into the state where the terminal optical element FL and the auxiliary table 9 connected to the first connection member 71 are opposed. Then, the exchanging operation between the first connection member 71 and the second connection member 72 is executed, and thereby the first connection member 71 is released from the second substrate stage 3 and connected to the first substrate stage 2, and the second connection member 72 is released from the first substrate stage 2 and connected to the second substrate stage 3. Then, the state is changed into the state where the first substrate stage 2 and the terminal optical element FL are opposed, and the exposure of the substrate P held on the first substrate stage 2 is executed in the exposure station ST1, and a predetermined process such as the measurement process and the exchanging of the substrate P on the second substrate stage 3 is executed in the measurement station ST2.

As described above, in the present embodiment, since the auxiliary table 9 provided on the first connection member 71 and movable to the position facing the terminal optical element FL is provided, then at least one of the first substrate stage 2, the second substrate stage 3, and the auxiliary table 9 can be arranged in the position facing the terminal optical element FL, and the optical path space of exposure light EL on the light emitting side of the terminal optical element FL can be kept filled with the liquid LQ at all times.

Consequently, even in the case where the substrate stage 2 or 3 does not face the terminal optical element FL, it is not necessary to execute the operation for recovering all the liquid, and thus a decline in the throughput of the exposure apparatus EX can be suppressed. Furthermore, generation of water marks caused by the lack of the liquid LQ and generation of temperature change due to the evaporation heat can be suppressed, and the deterioration of the exposure accuracy can be suppressed.

Moreover, in the present embodiment, the immersion space LS is moved from the one of the first substrate stage 2 and the second substrate stage 3 to the other one via the auxiliary table 9 capable of being close to or in contact with each of the first substrate stage 2 and the second substrate stage 3. In the present embodiment, on the side face of the first substrate stage 2 (first substrate table 22) and the side face of the second substrate stage 3 (second substrate table 32), the measurement mirrors 2Pz and 3Pz for measuring the position of the first and second substrate tables 22 and 32 project to the outside, and thus it is difficult to directly bring the top face 25 of the first substrate stage 2 and the top face 35 of the second substrate stage 3 close to or into contact with each other. Accordingly, it is difficult to move the immersion space LS from one of the first substrate stage 2 and the second substrate stage 3 to the other one. In the present embodiment, since the movement of the immersion space LS from one of the first substrate stage 2 and the second substrate stage 3 to the other one is executed via the auxiliary table 9, the immersion space LS is smoothly movable.

Furthermore, since the auxiliary table 9 is movable with respect to the first connection member 71, then even if the first connection member 71 is moved by the drive system 5, the auxiliary table 9 can be moved to the position facing the terminal optical element FL using the driving mechanism 80. Consequently, and even if the size of the surface of the auxiliary table 9 is relatively small, the optical path space on the light emitting side of the terminal optical element FL can be kept filled with the liquid LQ.

In the present embodiment, since the auxiliary table 9 is arranged with the measuring instrument 98, at the time when the terminal optical element FL and the auxiliary table 9 are opposed, such as the exchanging operation period between the first connection member 71 and the second connection member 72, the exposure light EL can be incident into the measuring instrument 98 via the liquid LQ. Moreover, the calibration operation based on the measured result of the measuring instrument 98 or the like can be executed at the time when the terminal optical element FL and the auxiliary table 9 are opposed, such as the exchanging operation period between the first connection member 71 and the second connection member 72. Consequently, the exposure apparatus EX can obtain a satisfactory throughput.

In the abovementioned embodiments, in the state where the top face 95 of the auxiliary table 9 and one of the top face 25 of the first substrate stage 2 and the top face 35 of the second substrate stage 3 are substantially flush, the immersion space LS is moved. However, there may be a slight step between the top face 95 of the auxiliary table 9 and one of the top face 25 of the first substrate stage 2 and the top face 35 of the second substrate stage 3, as long as the immersion space LS can be moved while suppressing leakage of the liquid LQ, generation of bubbles in the liquid LQ, and the like. Moreover, the top face 95 of the auxiliary table 9 is not limited to a plane, and may be a curved face, as long as the immersion space LS can be moved while suppressing leakage of the liquid LQ, generation of bubbles in the liquid LQ, and the like.

Furthermore, the liquid LQ may be supplied or recovered using the nozzle member 8, or the supply or recovery of the liquid LQ may be stopped, during the switching period from the state where the liquid LQ is held between the terminal optical element FL and one of the top face 25 of the first substrate stage 2 and the top face 35 of the second substrate stage 3, to the state where the liquid LQ is held between the terminal optical element FL and the other one of the top face 25 of the first substrate stage 2 and the top face 35 of the second substrate stage 3.

The size of the immersion space LS during the abovementioned exchanging operation period may differ from the size of the immersion space LS during the exposure of the substrate P. The size of the immersion space LS can be changed for example, by adjusting at least one of the liquid supply amount from the nozzle member 8 and the liquid recovery amount.

In the abovementioned embodiments, the case where the present invention is applied to an exposure apparatus including two substrate stages was described. However, the present invention may be also applied to an exposure apparatus including only one substrate stage, or an exposure apparatus including one substrate stage and a measurement stage which does not hold a substrate. In this case, an auxiliary table can be provided on a connection member connected to the substrate stage (stage main-structure). The substrate stage (stage main-structure) and the connection member are not necessarily connected releasably, but may be formed integrally.

In the abovementioned embodiments, the optical path space on the light emitting side (image plane side) of the terminal optical element FL is filled with the liquid LQ. However, as disclosed in PCT International Publication No. WO2004/019128, a projection optical system can be employed where the optical path space on the light incident side (object plane side) of the terminal optical element FL is filled with the liquid LQ.

Note that the liquid LQ of the present embodiments is water, but it may be a liquid other than water. For example, if the light source of the exposure light EL is an $F_2$ laser, this $F_2$ laser light will not pass through water, so the liquid LQ may be, for example, a fluorocarbon fluid such as a perfluoropolyether (PFPE) or a fluorocarbon oil that an $F_2$ laser is able to pass through. In addition, it is also possible to use, as the liquid LQ, liquids that have transmittance with respect to the exposure light EL and whose refractive indices are as high as possible and that are stable with respect to the photoresist coated on the projection optical system PL and the surface of the substrate P (for example, cedar oil).

Moreover as the liquid LQ, a liquid with a refractive index of 1.6 to 1.8 may be used. Furthermore, the optical element (such as the terminal optical element FL) of the projection optical system PL which is in contact with the liquid LQ may be formed from quartz (silica) or a single crystal material of a fluoride compound such as calcium fluoride (fluorite), barium fluoride, strontium fluoride, lithium fluoride, and sodium fluoride. A final optical element may be formed from a material with a refractive index that is higher than that of quartz or fluorite (for example 1.6 or more). As materials with a refractive index that is 1.6 or more, it is possible to use sapphire and germanium dioxide, etc., disclosed in PCT International Patent Publication No. WO 2005/059617, and potassium chloride (refractive index of approximately 1.75) disclosed in PCT International Patent Publication No. WO 2005/059618. Moreover, a thin film that has lyophilicity and/or a dissolution prevention mechanism may be formed on a portion of the surface of the final optical element (including at least the contact surface with the liquid) or all thereof. Note that silica has a high affinity with liquid, and a dissolution prevention mechanism is not required, but it is preferable to at least form a dissolution prevention film in the case of fluorite. For the liquid LQ, various liquids, for example a supercritical liquid, can be used. Here, a liquid with a refractive index that is higher than that of pure water (for example, 1.5 or higher) includes for example a predetermined liquid with a C—H bond and an O—H bond such as isopropanol with a refractive index of approximately 1.5 and glycerol (glycerine) with a refractive index of approximately 1.61; a predetermined liquid (organic solvent) such as hexane, heptane, decane; and Decalin (Decahydronaphthalene) with a refractive index of approximately 1.60. Alternatively, the liquid can be one that is a mixture of two or more types of optional liquids among these predetermined liquids, or one that is made by adding (mixing) at least one of these liquids to/with pure water. Alternatively, as the liquid, one in which an acid or a base such as $H^+$, $Cs^+$, and $K^+$, or $Cl^-$, $SO_4^{2-}$, and $PO_4^{2-}$ is added to (mixed with) pure water can be used, and a liquid in which fine particles of for example Al oxide are added to (mixed with) pure water can be used. Furthermore, the liquid is preferably one for which the light absorption coefficient is small, the temperature dependency is small, and which is stable with respect to the photosensitive material (or top coat film or anti-reflection film, etc.) painted on the surface of the projection optical system and/or the substrate. Furthermore, a top coat film and the like that protects the photosensitive material and substrate from the liquid can be provided on the substrate.

In the abovementioned embodiments, respective position information for the mask stage and the substrate stage is measured using an interference system. However the invention is not limited to this and for example, an encoder system which detects a scale (grating) provided on each stage may be used. In this case, preferably a hybrid system is furnished with both of an interference system and an encoder system, and calibration of the measurement results of the encoder system is performed using the measurement results of the interference system. Moreover, position control of the stage may be performed using the interference system and the encoder system interchangeably, or using both.

In the abovementioned embodiments, the structure of an immersion system such as a nozzle member is not limited to the abovementioned structure, and an immersion system disclosed for example in PCT International Publication No. WO2004/086468 (corresponding to U.S. Patent Application Publication No. 2005/0280791) and PCT International Publication No. WO2005/024517 may be used.

For the substrate P in each of the abovementioned embodiments, not only a semiconductor wafer for fabricating semiconductor devices can be used, but also, for example, a glass substrate for a display device, a ceramic wafer for a thin film magnetic head, or a mask or the original plate of a reticle (synthetic quartz, silicon wafer) used in an exposure apparatus, or a film member etc. can be used. Furthermore, the shape of the substrate is not limited to a circle, and may be another shape such as a rectangle.

The exposure apparatus EX can be applied to a step-and-repeat type projection exposure apparatus (stepper) that fully exposes the pattern of the mask M with the mask M and the substrate P in a stationary state, and successively moves the substrate P stepwise, in addition to a step-and-scan type exposure apparatus (scanning stepper) that synchronously moves the mask M and the substrate P, and scan-exposes the pattern of the mask M.

Furthermore, the step-and-repeat type exposure may be such that a reduced image of a first pattern is transferred onto the substrate P using the projection optical system with the first pattern and the substrate P in a substantially stationary state, then the reduced image of a second pattern is partially superposed on the first pattern and fully transferred onto the substrate P using the projection optical system with the second pattern and the substrate P in a substantially stationary state (a stitch type full exposure apparatus). In addition, the stitch type exposure apparatus can also be adapted to a step-and-stitch type exposure apparatus that partially and superposingly transfers at least two patterns onto the substrate P, and sequentially moves the substrate P.

In the abovementioned embodiments, an exposure apparatus furnished with a projection optical system PL was described as an example, however the present invention can also be applied to an exposure apparatus and an exposure method which does not use a projection optical system PL. Even in the case where a projection optical system PL is not used, the exposure light can be irradiated onto the substrate via an optical member such as a lens, and an immersion space can be formed in a predetermined space between such an optical member and the substrate.

The type of exposure apparatus EX is not limited to semiconductor device fabrication exposure apparatuses that expose the pattern of a semiconductor device on the substrate P, but can also be widely adapted to, for example, exposure apparatuses for fabricating liquid crystal display devices or displays, or exposure apparatuses for fabricating thin film magnetic heads, imaging devices (CCDs), micro machines, MEMS, DNA chips, and reticles or masks.

The embodiments discussed above use a light transmitting type mask, which forms a prescribed shielding pattern (or a phase pattern, or a dimming pattern) onto a substrate that has light transmitting characteristics. Instead of such a mask, for example, as disclosed in U.S. Pat. No. 6,778,257, an electronic mask (called a variable form mask; for example this includes a DMD (Digital Micro-mirror Device) as one type of non-radiative type image display element (also called a spatial light modulator (SLM)) may be used that forms a transmitted pattern, a reflected pattern, or a light emitting pattern, based on digital data of the pattern to be exposed.

Furthermore, the present invention can also be applied to an exposure apparatus (lithography system) which exposes a run-and-space pattern on a substrate P by forming interference fringes on the substrate P, as disclosed for example in PCT International Patent Publication No. WO2001/035168.

Moreover, the present invention can also be applied to an exposure apparatus as disclosed for example in Published Japanese Translation No. 2004-519850 of PCT International Publication (corresponding U.S. Pat. No. 6,611,316), which combines patterns of two masks on a substrate via a projection optical system, and double exposes a single shot region on the substrate at substantially the same time, using a single scan exposure light. Moreover, the present invention can be also applied to a proximity type exposure apparatus, a mirror projection aligner, and the like.

As far as is permitted, the disclosures in all of the Japanese Patent Publications and U.S. patents related to exposure apparatuses and the like cited in the above respective embodiments and modified examples, are incorporated herein by reference.

As described above, the exposure apparatus EX of the above-described embodiments is manufactured by assembling various subsystems, including each constituent element, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes, for example, the mutual mechanical connection, the wiring and connection of electrical circuits, and the piping and connection of the atmospheric pressure circuit of the various subsystems. Of course, before the process of assembling the exposure apparatus from these various subsystems, there are also the processes of assembling each individual subsystem. When the process of assembling the exposure apparatus from the various subsystems is finished, a comprehensive adjustment is performed to ensure the various accuracies of the exposure apparatus as a whole. Furthermore, it is preferable to manufacture the exposure apparatus in a clean room wherein, for example, the temperature and the cleanliness level are controlled.

Figure 11:
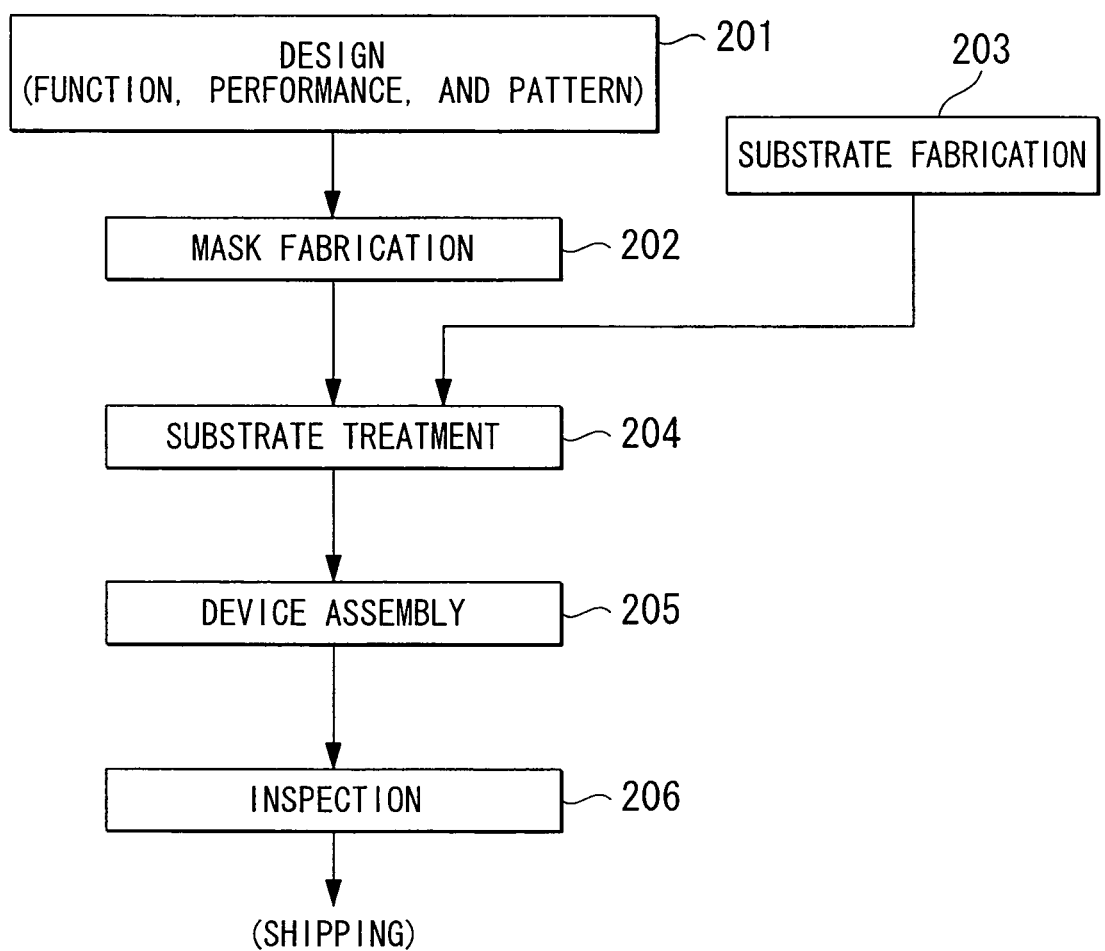
FIG. 11 is a flow chart diagram that depicts one example of a process of fabricating a microdevice.

In addition, as shown in FIG. 11, a micro-device, such as a semiconductor device, is manufactured by, for example: a step 201 of designing the functions and performance of the micro-device; a step 202 of fabricating a mask (reticle) based on this design step; a step 203 of fabricating a substrate, which is the base material of the device; a substrate treatment step 204 that includes substrate treatment (exposure process) that exposes the pattern of the mask onto the substrate according to the embodiments discussed above, and develops the exposed substrate; a device assembling step 205 (comprising fabrication processes, such as a dicing process, a bonding process, and a packaging process); and an inspecting step 206.

What is claimed is:

1. An immersion exposure apparatus comprising:
a projection optical system from which an exposure beam exits;
a stage system that has a first stage and a second stage that is capable of moving independently from the first stage, the first stage having a first table and a first movable member, the first table configured to hold a first substrate and being movably held by the first movable member, the second stage having a second table and a second movable member, the second table configured to hold a second substrate and being movably held by the second movable member;
an immersion system that has an immersion member disposed adjacent to the projection optical system and that supplies a liquid to and forms an immersion region directly below the projection optical system;
a liquid holding member that is movable relative to the first and second tables and that is provided on a moving body of the first stage, the moving body holding the first movable member, the liquid holding member and the moving body being movable relative to one another, the liquid holding member being movable relative to the projection optical system and the immersion member so as to be selectively positionable below the projection optical system and the immersion member; and
a drive apparatus that moves at least one of the moving body and the liquid holding member relative to one another;
a drive system that moves the first and second stages during a transition operation so as to transit from a first state to a second state, the first state in which the immersion region is maintained between the projection optical system and the first table, the second state in which the immersion region is maintained between the projection optical system and the second table, wherein
during at least a part of the transition operation, at least one of the liquid holding member and the moving body is moved relative to the other of the liquid holding member and the moving body by the drive apparatus,
during the transition operation, the immersion region is moved from the first table to the second table via and over an upper surface of the liquid holding member while being maintained directly below the projection optical system,
the substrate is exposed with the exposure beam via the projection optical system and the liquid, and
during the exposure, the substrate is moved relative to the immersion region by the first stage.

2. The apparatus according to claim 1, wherein the upper surface of the liquid holding member is disposed substantially flush with surfaces of the first and second tables during the transition operation.

3. The apparatus according to claim 2, further comprising:
a measurement system that has an optical system and measures a positional information of the substrate, the optical system being disposed in a second area different from a first area in which the projection optical system is disposed,
wherein at least a part of the exposure operation and a part of the measurement operation are performed in parallel with each other, the exposure operation being for one of the first and second substrates mounted on one of the first and second tables that is disposed directly below the projection optical system, the measurement operation being for the other one of the first and second substrates mounted on the other one of the first and second tables that is disposed directly below the optical system.

4. A device manufacturing method comprising:
exposing a substrate with the exposure apparatus according to claim 1; and
developing the exposed substrate.

5. An immersion exposure method comprising:
mounting a substrate on a first stage, the first stage having a first table and a first movable member, the first table being movably held by the first movable member;
exposing the substrate mounted on the first stage with an exposure beam via a projection optical system and a liquid, the liquid being supplied to below the projection optical system to form an immersion region;
moving the first stage and a second stage during a transition operation so as to transit from a first state to a second state, the first state in which the immersion region is maintained between the projection optical system and the first table, the second state in which the immersion region is maintained between the projection optical system and a second table of the second stage, the second stage being capable of moving independently from the first stage; and
during at least a part of the transition operation, performing a relative movement between a moving body of the first stage and a liquid holding member that is movable relative to the first and second tables and that is provided on the moving body, the moving body holding the first movable member, the liquid holding member and the moving body being movable relative to one another, the liquid holding member being movable relative to the projection optical system so as to be selectively positionable below the projection optical system, wherein
during the transition operation, the immersion region is moved from the first table to the second table via and over an upper surface of the liquid holding member while the immersion region is maintained directly below the projection optical system, and
during the exposure, the substrate is moved relative to the immersion region by the first stage.

6. The method according to claim 5, wherein, in the transition operation, the upper surface of the liquid holding member is disposed substantially flush with surfaces of the first and second tables.

7. The method according to claim 6, wherein a second substrate is mounted on the second table of the second stage, and at least a part of the exposure operation and a part of a measurement operation are performed in parallel with each other, the exposure operation being for one of the substrate and the second substrate mounted on one of the first and second tables that is disposed directly below the projection optical system, the measurement operation being for the other one of the substrate and the second substrates mounted on the other one of the first and second tables, the measurement operation being performed with an optical system that is disposed in a second area, the second area being different from a first area in which the projection optical system is disposed.

8. A device manufacturing method comprising:
exposing a substrate with the exposure apparatus according to claim 5; and
developing the exposed substrate.

* * * * *